United States Patent
Shimizu

(10) Patent No.: US 10,452,475 B2
(45) Date of Patent: Oct. 22, 2019

(54) MEMORY SYSTEM AND RESISTANCE CHANGE TYPE MEMORY

(71) Applicant: TOSHIBA MEMORY CORPORATION, Minato-ku, Tokyo (JP)

(72) Inventor: Naoki Shimizu, Kanagawa (JP)

(73) Assignee: TOSHIBA MEMORY CORPORATION, Tokyo (JP)

(*) Notice: Subject to any disclaimer, the term of this patent is extended or adjusted under 35 U.S.C. 154(b) by 128 days.

(21) Appl. No.: 15/703,207

(22) Filed: Sep. 13, 2017

(65) Prior Publication Data
US 2018/0276071 A1    Sep. 27, 2018

(30) Foreign Application Priority Data

Mar. 23, 2017 (JP) ................................ 2017-057791

(51) Int. Cl.
| | | |
|---|---|---|
| *G06F 11/10* | (2006.01) | |
| *G11C 13/00* | (2006.01) | |
| *G11C 11/16* | (2006.01) | |
| *G11C 29/52* | (2006.01) | |
| *G11C 29/04* | (2006.01) | |

(52) U.S. Cl.
CPC ...... *G06F 11/1068* (2013.01); *G06F 11/1048* (2013.01); *G11C 11/1673* (2013.01); *G11C 11/1675* (2013.01); *G11C 11/1693* (2013.01); *G11C 11/1697* (2013.01); *G11C 13/004* (2013.01); *G11C 13/0023* (2013.01); *G11C 13/0038* (2013.01); *G11C 13/0061* (2013.01); *G11C 13/0069* (2013.01);
(Continued)

(58) Field of Classification Search
CPC ............. G06F 11/1068; G06F 11/1048; G11C 11/1673; G11C 11/1675; G11C 11/1693; G11C 11/1697; G11C 13/0023; G11C 13/0038; G11C 13/004; G11C 13/0061; G11C 13/0069; G11C 29/52; G11C 2013/0076; G11C 2029/0411
USPC .......................... 714/764, 766, 768, 773, 799
See application file for complete search history.

(56) References Cited

U.S. PATENT DOCUMENTS 8,856,614 B2 * 10/2014 Yamashita .......... G06F 11/1443
714/752
9,348,697 B2 * 5/2016 Hoya ...................... G06F 11/10
(Continued)

FOREIGN PATENT DOCUMENTS

| JP | 2013025835 A | 2/2013 |
|---|---|---|
| JP | 2013200904 A | 10/2013 |
| JP | 2014022030 A | 2/2014 |

*Primary Examiner* — John J Tabone, Jr.
(74) *Attorney, Agent, or Firm* — Holtz, Holtz & Volek PC

(57) ABSTRACT

According to one embodiment, a memory system includes a resistance change type memory including a memory cell configured to hold first data and an ECC circuit configured to detect and to correct an error in the first data; and a controller configured to control an operation of the resistance change type memory. In a read operation for the memory, when the first data from the memory cell includes an error, the memory transmits second data in which the error is corrected and a first signal to the controller. The controller transmits a control signal and a write command to the memory based on the first signal. The memory writes the second data to the memory cell based on the control signal and the write command.

19 Claims, 12 Drawing Sheets

(52) U.S. Cl.
CPC ...... *G11C 29/52* (2013.01); *G11C 2013/0076* (2013.01); *G11C 2029/0411* (2013.01)

(56) References Cited

U.S. PATENT DOCUMENTS

| | | | | |
|---|---|---|---|---|
| 9,459,961 | B2* | 10/2016 | Hoya | G06F 11/10 |
| 2010/0332900 | A1* | 12/2010 | Yang | G06F 11/106 |
| | | | | 714/16 |
| 2011/0289386 | A1* | 11/2011 | Yang | G06F 11/106 |
| | | | | 714/764 |
| 2013/0024744 | A1* | 1/2013 | Takizawa | G06F 11/1048 |
| | | | | 714/763 |
| 2014/0016404 | A1 | 1/2014 | Kim et al. | |
| 2015/0074489 | A1* | 3/2015 | Kashiwagi | G11C 7/10 |
| | | | | 714/763 |
| 2015/0074491 | A1* | 3/2015 | Hoya | G06F 11/10 |
| | | | | 714/764 |
| 2016/0077915 | A1* | 3/2016 | Hoya | G06F 11/10 |
| | | | | 714/764 |
| 2017/0109232 | A1* | 4/2017 | Cha | G06F 11/106 |
| 2018/0052732 | A1* | 2/2018 | Jo | G06F 11/1068 |
| 2019/0073261 | A1* | 3/2019 | Halbert | G11C 29/42 |

\* cited by examiner

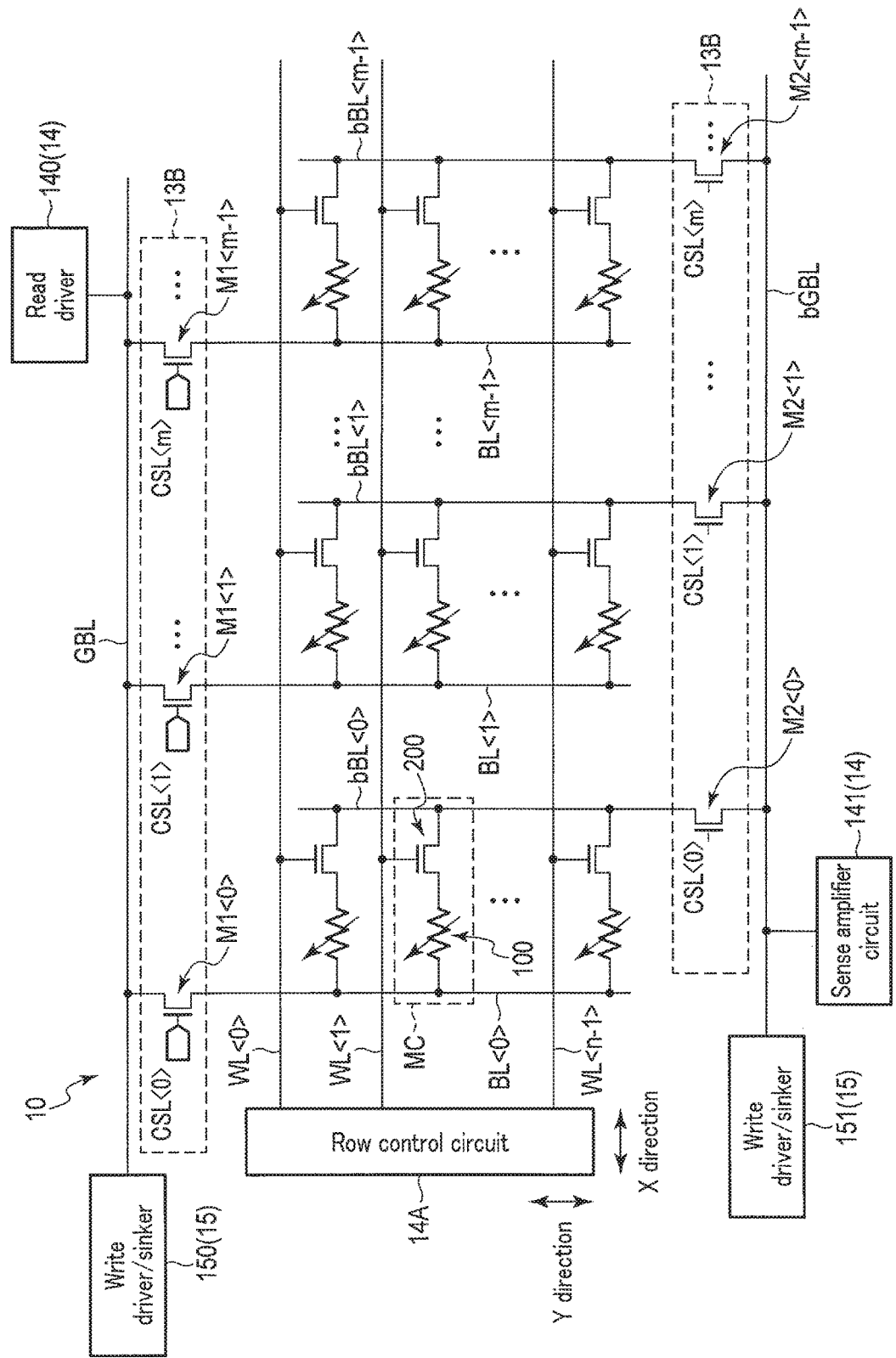
F I G. 3

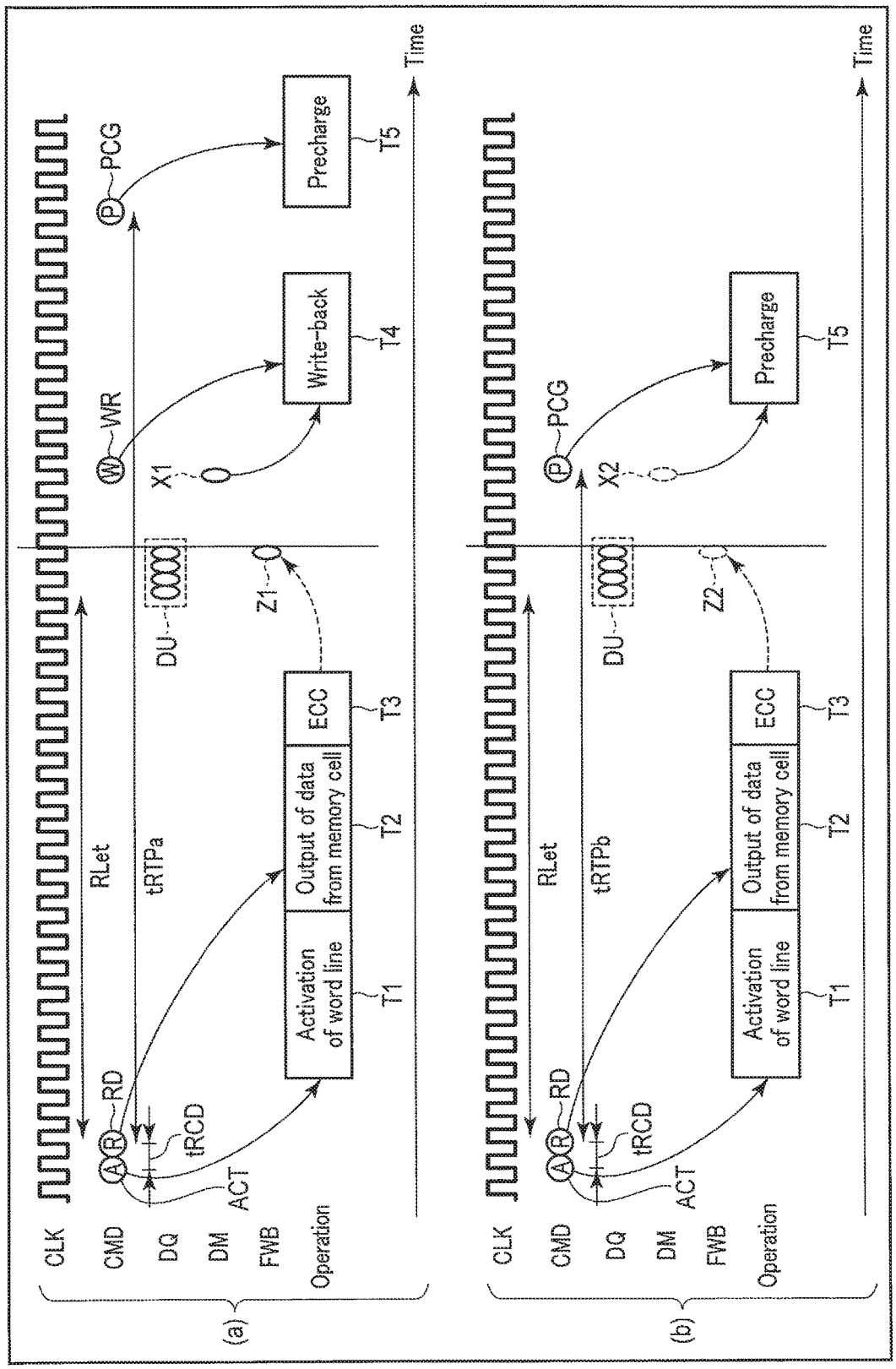
F I G. 5

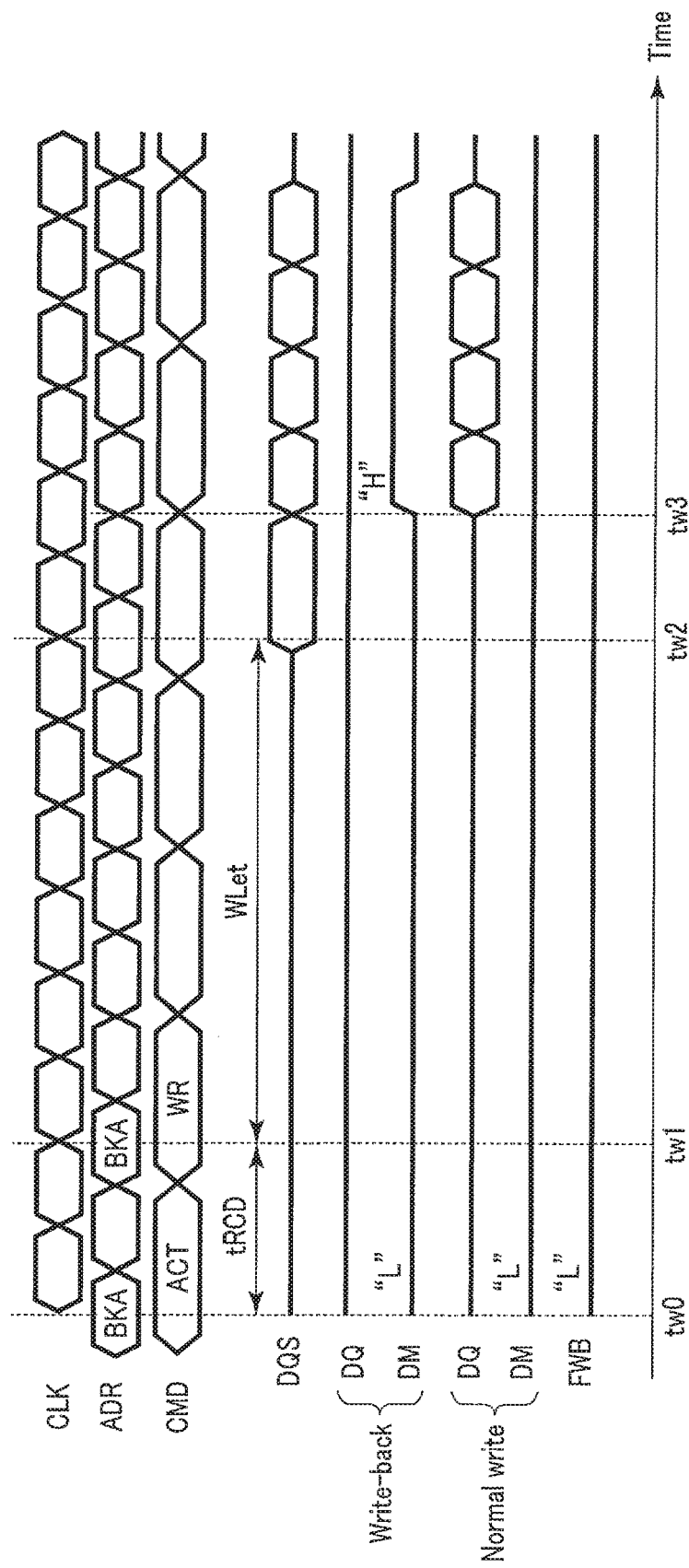
F I G. 9

MEMORY SYSTEM AND RESISTANCE CHANGE TYPE MEMORY

CROSS-REFERENCE TO RELATED APPLICATIONS

This application is based upon and claims the benefit of priority from Japanese Patent Application No. 2017-057791, filed Mar. 23, 2017, the entire contents of which are incorporated herein by reference.

FIELD

Embodiments described herein relate generally to a memory system and a resistance change type memory.

BACKGROUND

Recently, a resistance change type memory using a resistance change element in a memory element has attracted attention as a new memory device.

BRIEF DESCRIPTION OF THE DRAWING

FIGS. 2 and 3 are diagrams showing an example of the internal configuration of a resistance change type memory according to the embodiment.

FIG. 5 is a diagram showing an exemplary operation of the memory system and the resistance change type memory according to the first embodiment.

FIGS. 6, 7, 8 and 9 are illustrations of a specific example of the resistance change type memory according to the first embodiment.

DETAILED DESCRIPTION

In general, according to one embodiment, a memory system includes: a resistance change type memory including a memory cell configured to hold first data and an ECC circuit configured to detect and correct an error in the first data; and a controller configured to control an operation of the resistance change type memory. In a read operation for the resistance change type memory, when the first data from the memory cell includes an error, the resistance change type memory transmits second data in which the error is corrected and a first signal to the controller, and the controller transmits a control signal and a write command to the resistance change type memory based on the first signal; and the resistance change type memory writes the second data to the memory cell based on the control signal and the write command.

[Embodiments]

Memory systems and resistance change type memories according to embodiments will be described with reference to FIGS. 1-12. In the following embodiments, the same reference symbol will be used to denote structural elements having a similar or corresponding function and configuration. To distinguish the structural elements, a numeral or an alphabet will be added to the end of the reference symbol.

(1) First Embodiment

A memory system and a resistance change type memory according to a first embodiment will be described with reference to FIGS. 1-9.

(a) Exemplary Configuration

An exemplary configuration of the memory system and the resistance change type memory according to the first embodiment will be described with reference to FIGS. 1-4.

Figure 1:
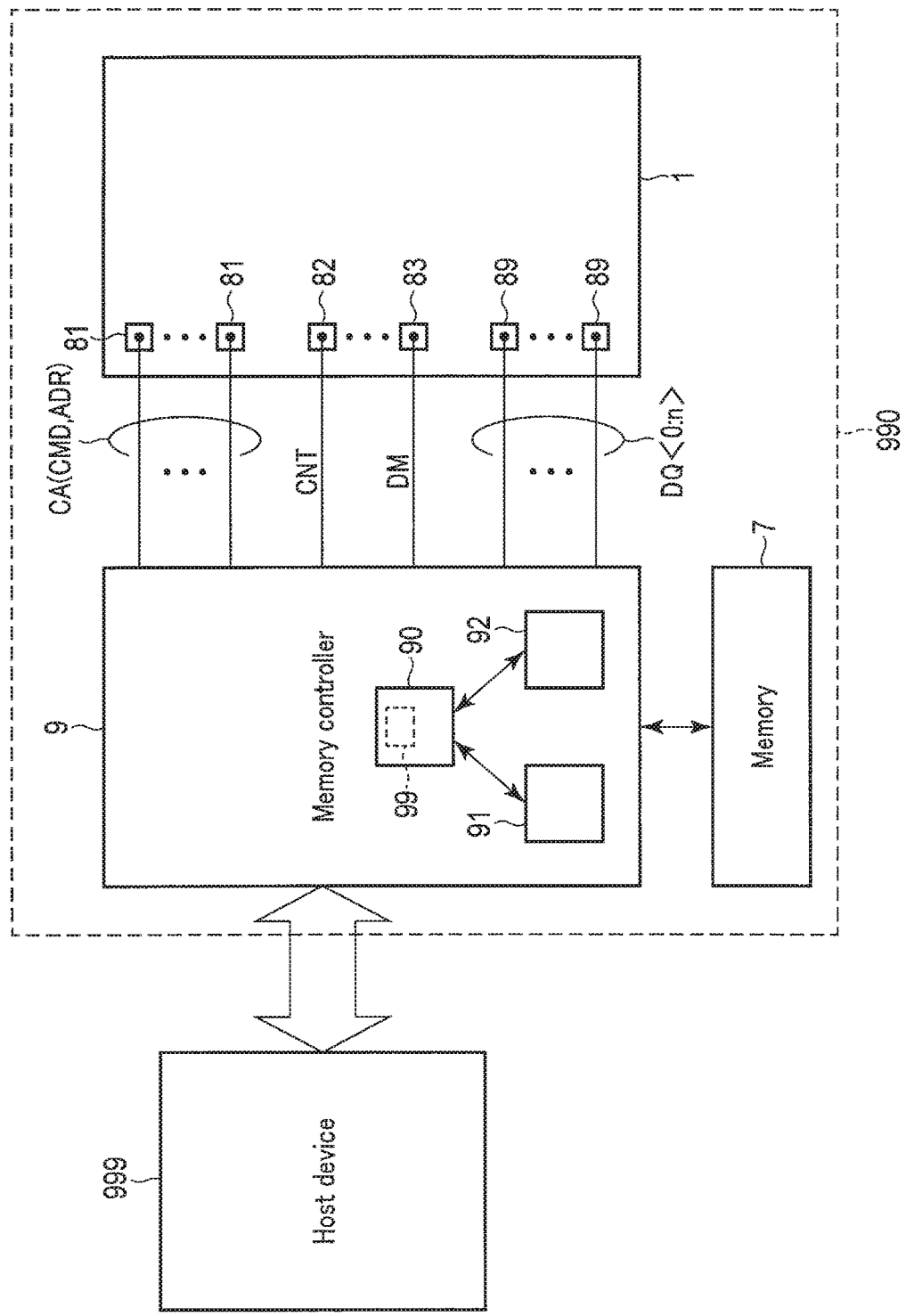
FIG. 1 is a schematic block diagram showing an exemplary configuration of a memory system according to an embodiment.

FIG. 1 is a schematic diagram illustrating a memory system 990 according to the first embodiment.

As illustrated in FIG. 1, the memory system 990 includes at least a resistance change type memory 1 and a memory controller 9.

The resistance change type memory 1 can store data. The resistance change type memory 1 includes a plurality of terminals (pads or pins) 81, 82, 83 and 89. The terminals 81, 82, 83 and 89 are used to transmit and receive various signals between the resistance change type memory 1 and the controller 9.

For example, the terminal 81 is used to receive a signal CA. The signal CA includes a command CMD and an address ADR. The terminals 82 and 83 are used to transmit and receive control signals CNT and DM. For example, the terminal 83 is used to transmit and receive the data mask signal DM. The terminal 89 is used to transmit and receive data DQ. The data DQ (DQ<0: n>) is transferred between the resistance change type memory 1 and the controller 9.

The resistance change type memory 1 is electrically connected to the memory controller 9 via an interconnect connected to the terminals 81, 82, 83 and 89.

The memory controller 9 controls the operation of the resistance change type memory 1 in response to a request from a host device 999.

The memory controller 9 includes a processor 90.

The processor 90 controls an internal circuit (functional unit) of the memory controller 9 and performs various computation processes in response to a request from the host device 999.

The processor 90 includes, for example, a register 99. The register 99 can temporarily hold, for example, data generated in the processor 90, data supplied from the resistance change type memory 1 and management information (e.g. access history) of the resistance change type memory 1.

For example, the memory controller 9 includes a regular routine control circuit 91 and an interrupt routine control circuit 92. The processor 90 can control the operations of the regular routine control circuit 91 and interrupt routine control circuit 92.

The regular routine control circuit 91 performs a computation process and a control process to cause the resistance change type memory 1 to perform an operation corresponding to a request from the host device 999 in a predetermined order.

The interrupt routine control circuit 92 performs a computation process and a control process for an interrupt in a regular routine in accordance with the operating status of the memory controller 9 and the resistance change type memory 1.

For example, the memory controller 9 may use information in a memory device 7 in order to control the operation of the resistance change type memory 1. For example, the memory device 7 is a DRAM in the memory system 990.

The memory device 7 holds various items of information, such as a management table of data/address in the resistance change type memory 1 and a history of access to an address (memory cell) in the resistance change type memory 1.

The memory device 7 can be provided outside the memory system 990 (e.g. it can be provided in a host device) or inside the memory controller 9. As the memory device 7, a memory other than the DRAM (e.g. a flash memory and an SRAM) can be used.

The memory system 990 is connected to a host device 999 using at least one of an interconnect, a connector, a pin, a pad, a cable and wireless communication.

Data is transferred between the memory controller 9 and the host device 999 on the basis of, e.g. an interface standard.

The host device 999 requests the memory controller 9 to write data to the resistance change type memory 1 and read data therefrom.

For example, the host device 999 is at least one selected from a digital camera, a smartphone, a feature phone, a game machine, a server, a PC, a processor and the like.

The resistance change type memory 1 can be controlled directly by the host device 999 on the basis of various signals and commands without being controlled by the memory controller 9. The resistance change type memory 1 can be provided inside the memory controller 9 or the host device 999.

Figure 2:
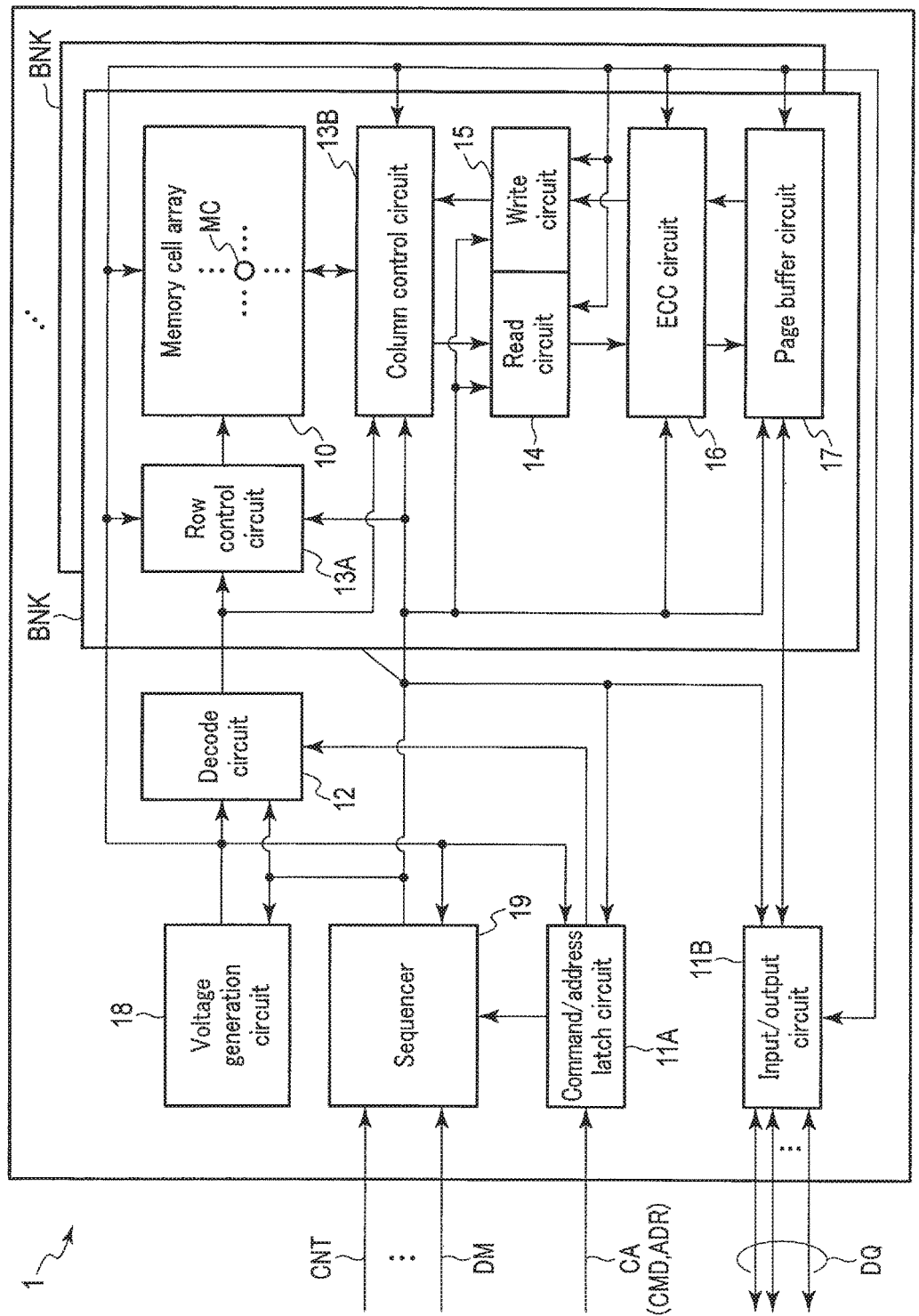

FIG. 2 is a schematic block diagrams illustrating the internal configuration of the resistance change type memory 1 according to the first embodiment.

In the first embodiment, the resistance change type memory 1 includes circuits 10-19 described below.

As illustrated in FIG. 2, the resistance change type memory 1 includes a memory cell array 10.

The memory cell array 10 includes a plurality of memory cells MC. In the resistance change type memory 1, the memory cells MC include resistance chance elements as memory elements (data holding units).

A command/address latch circuit 11A temporarily holds a command CMD and an address ADR supplied from the memory controller 9 (or the host device 999).

An input/output circuit (also referred to as an I/O circuit hereinafter) 11B temporarily holds data supplied from the memory controller 9 (or the host device 999) and data supplied from the memory cell array 10 such that data can be input to and output from the input/output circuit in accordance with the operation timing of the resistance change type memory 1.

A decoder circuit 12 decodes the address ADR supplied from the command/address latch circuit 11A. The decoder circuit 12 includes a row decoder and a column decoder. For example, the row decoder includes a page decoder.

A row control circuit 13A selects a row of the memory cell array 10 on the basis of a decode result of a row address of the address ADR.

A column control circuit 13B selects a column of the memory cell array 10 on the basis of a decode result of a column address of the address ADR.

A read circuit (also referred to as a read control circuit) 14 reads data of the memory cell array 10. The read circuit 14 is connected to the memory cell array 10 via the column control circuit 13B. The read circuit 14 includes a sense amplifier circuit, a read driver, a read control signal generation circuit and the like.

A write circuit (also referred to as a write control circuit) 15 writes data to the memory cell array 10. The write circuit 15 is connected to the memory cell array 10 via the column control circuit 13B. The write circuit 15 includes a write drive/sinker, a write control signal generation circuit and the like.

An error checking and correcting (ECC) circuit 16 adds parity to data to be written. The data to which parity is added is written to the memory cell array 10 by the write circuit 15. The ECC circuit 16 generates a syndrome based on the parity to perform an error detection process for the data output from the memory cell array 10. If an error is detected, the ECC circuit 16 corrects the detected error.

A page buffer circuit (data hold circuit) 17 can temporarily hold data supplied from the ECC circuit 16 (data read from the memory cell array 10) and data supplied from the I/O circuit 11B (data to be written to the memory cell array 10). The page buffer circuit 17 can hold, for example, data of one-page data size.

A voltage generation circuit 18 generates various voltages used to write data (write operation) and read data (read operation). The voltage generation circuit 18 uses a voltage applied from an external device (e.g. the memory controller 9 or the host device 999) of the resistance change type memory 1. For example, the voltage generation circuit 18 includes at least a write pulse generator and a read pulse generator.

A sequencer 19 controls the operations of the foregoing circuits in response to control signals CNT and DM and commands CMD. The sequencer 19 can control operations of writing data to the memory cell array 10 and reading data therefrom. The control signals CNT and DM can be held temporarily in a latch circuit (not shown).

For example, the resistance change type memory 1 includes a plurality of banks BNK as a control unit of the memory. Each of the banks BNK includes at least a memory cell array (sub array) 10, a row control circuit 13A, a column control circuit 13B, a read circuit 14 and a write circuit 15. For example, two or more banks BNK can be operated in parallel (substantially at the same time). For example, the address ADR includes a bank address. Accordingly, one bank can be selected from among the banks BNK.

In the example shown in FIG. 2, the ECC circuit 16 and the page buffer circuit 17 are provided for each of the banks BNK.

For example, the sequencer 19 is shared among the banks BNK. The sequencer 19 can control the operations of the banks BNK.

FIG. 3 is an equivalent circuit diagram illustrating the internal configuration of the memory cell array of the resistance change type memory according to the first embodiment.

As illustrated in FIG. 3, the memory cells MC are arranged in an array in the memory cell array 10.

In the memory cell array 10, a plurality of word lines WL (WL<0>, WL<1>, . . . , WL<n-1>) are provided.

In the memory cell array 10, a plurality of bit lines EL (BL<0>, BL<1>, . . . , BL<m-1>) and bBL (bBL<0>, bBL<1>, . . . , dBL<m-1>) are provided.

The memory cells MC arranged in the X direction are connected to a common word line WL.

The word lines WL are activated or inactivated based upon the decode result of the address ADR. Accordingly, a memory cell MC corresponding to the address ADR is selected with respect to the row of the memory cell array 10.

The memory cells MC arranged in the Y direction are connected to a common bit line BL and a common bit line bBL. Hereinafter, a pair of bit lines BL and bBL connected to a memory cell MC will also be referred to as a bit line pair. For distinguishing these bit lines, one (e.g. bit line bBL) of the paired bit lines BL and bBL will also be referred to as a source line.

For example, the memory cell array 10 has a hierarchical bit line system. In this system, global bit lines GBL and bGBL are provided in the memory cell array 10. A plurality of switching elements (e.g. field-effect transistors) M1 (M1<0>, M1<1>, . . . , M1<m-1>), M2 (M2<0>, M2<1>, . . . , M2<m-1>) are connected to each of the global bit lines GBL and bGBL.

Each of the bit lines BL is connected to the global bit line GBL through its corresponding switching element M1. Each of the bit lines bBL is connected to the global bit line bGBL through its corresponding switching element M2.

The switching elements M1 and M2 are activated (turned on) or inactivated (turned off) based upon the decode result of the address ADR. Accordingly, a memory cell MC corresponding to the address ADR is selected with respect to the column of the memory cell array 10.

For example, write driver/sinkers 150 and 151 are connected to the global bit lines GBL and bGBL, respectively. In data write operation, one of the write driver/sinkers 150 and 151 functions as a driver and the other functions as a sinker. The write driver/sinkers 150 and 151 include at least one of a voltage source and a current source in accordance with a method of writing data to the memory cells MC.

A read driver 140 is connected to the global bit line GBL. A sense amplifier circuit 141 is connected to the global bit line bGBL.

The read driver 140 includes a current source or a voltage source in accordance with a method of reading data of the memory cells MC. The sense amplifier circuit 141 senses variations in the value of current or the potential of a node, which is due to the output of the memory cells MC, and amplifies a signal of the sensing result.

Each of the memory cells MC includes a memory element 100 and a cell transistor 200.

One terminal (one end) of the memory element 100 is connected to the bit line BL. The other terminal (the other end) of the memory element 100 is connected to one terminal (one of the source/drain) of the cell transistor 200. The other terminal (the other of the source/drain) of the cell transistor 200 is connected to the bit line dBL. The gate of the cell transistor 200 is connected to the word line WL.

In accordance with the configuration of the memory cell array 10, one memory cell MC may include two or more memory elements 100, and one memory cell MC may include two or more cell transistors 200. In a memory cell MC, two or more cell transistors 200 can be connected to one memory element 100, and one cell transistor 200 can be connected to two or more memory elements 100.

In the resistance change type memory 1, the memory element 100 is a resistance change element.

The resistance change element 100 can be rendered in a plurality of resistance states (resistance values). Data of one or more bits is associated with the resistance states of the resistance change element 100.

For example, the memory cells MC hold one-bit data ("0" data and "1" data). In this case, if the resistance change element 100 is set in a first resistance state (e.g. a low-resistance state), the memory cells MC are set in a first data holding state (e.g. a "0" data holding state). If the resistance change element 100 is set in a second resistance state (e.g. a high-resistance state), the memory cells MC are set in a second data holding state (e.g. a "1" data holding state).

If the resistance change element 100 is supplied with a voltage or a current of a certain value, the resistance state of the resistance change element 100 changes. It depends upon the type of the resistance change element 100 whether the resistance state of the resistance change element 100 varies with the voltage or current.

For example, the resistance change type memory 1 of the first embodiment is a magnetoresistive random-access memory (MRAM). In the MRAM, a magnetoresistive effect element is used in the resistance change element 100.

Figure 4:
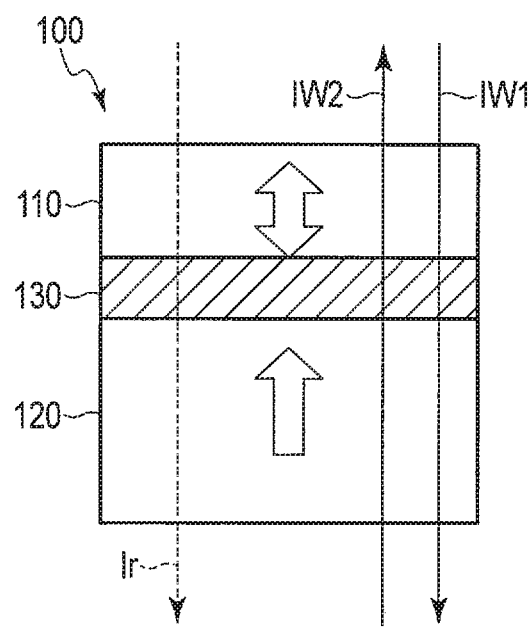
FIG. 4 is a diagram showing an exemplary configuration of a memory element of the resistance change type memory according to the embodiment.

FIG. 4 is a diagram showing an exemplary configuration of a memory element (a magnetoresistive effect element) of the resistance change type memory according to the first embodiment and also showing a section of the magnetoresistive effect element.

As shown in FIG. 4, the magnetoresistive effect element 100 includes at least two magnetic layers 110 and 120 and one nonmagnetic layer 130.

The two magnetic layers 110 and 120 each have magnetization. The direction of magnetization of the magnetic layer 110 is variable. The direction of magnetization of the magnetic layer 120 is invariable (fixed).

In the first embodiment, the magnetic layer 110 whose magnetization direction is variable is called a storage layer 110 and the magnetic layer 120 whose magnetization direction is invariable is called a reference layer 120.

The nonmagnetic layer 130 is provided between the two magnetic layers 110 and 120. The nonmagnetic layer 130 functions as a tunnel barrier layer 130. For example, the tunnel barrier layer 130 is an insulation film including magnesium oxide.

For example, a magnetic tunnel junction is formed by the two magnetic layers 110 and 120 and the tunnel barrier layer 130. In the first embodiment, the magnetoresistive effect element 100 having a magnetic tunnel junction is called an MTJ element 100.

For example, the magnetic layers 110 and 120 have perpendicular magnetic anisotropy. The magnetization direction (magnetization easy axis direction) of the magnetic layers 110 and 120 is substantially perpendicular to the surfaces of the magnetic layers. The magnetization direction of the magnetic layers 110 and 120 is also substantially parallel to the stacking direction of the layers 110, 120 and 130. The perpendicular magnetic anisotropy of the magnetic layers 110 and 120 is caused by use of interface magnetic anisotropy of the magnetic layers and the like. The MTJ element using the perpendicular magnetic anisotropy is called a perpendicular magnetic MTJ element.

The resistance state of the MTJ element magnetoresistive effect element) 100 varies with a relative relationship (magnetization alignment) between the magnetization direction of the storage layer 110 and that of the reference layer 120.

When the magnetization direction of the storage layer 110 is equal to (parallel to) that of the reference layer 120, the MTJ element 100 has a first resistance state (a first magnetization alignment state).

When the magnetization direction of the storage layer 110 is opposite to (antiparallel to) that of the reference layer 120, the MTJ element 100 has a second resistance state (a second magnetization alignment state). The resistance of the MTJ element 100 having a second resistance state is higher than that of the MTJ element 100 having a first resistance state.

As described above, the MTJ element 100 can be rendered in one of the low-resistance and high-resistance states in accordance with the magnetization alignment of the two magnetic layers 110 and 120.

In the first embodiment, the magnetization alignment state in which the magnetization direction of the storage layer 110 and that of the reference layer 120 in the MTJ element 100 are equal to each other, is called a parallel state (or a P state), and the magnetization alignment state in which the magnetization direction of the storage layer 110 and that of the reference layer 120 in the MTJ element 100 are opposite to each other, is called an antiparallel state (or an AP state).

(b) Operation

An operation of the resistance change type memory (e.g. MRAM) according to the first embodiment will be described below.

(b-1) Write and Read Operations for Memory Cells

Write and read operations for the memory cells of the MRAM according to the first embodiment will be described. Here, the operation of a memory cell including an MTJ element will be described with reference to FIG. 4.

<Write Operation>

In the MRAM of the first embodiment, when data is written to a memory cell MC, the magnetization alignment state of the MTJ element 100 is set in a state corresponding to the data to be written.

In the MRAM of the first embodiment, the direction of magnetization of the storage layer 110 is changed by applying spin torque to the magnetization of the storage layer 110. This data write is called a spin torque transfer (STT) system. The MRAM using an STT system is called an STT-MRAM.

In the STT-MRAM, the magnetization alignment of the two magnetic layers 110 and 120 in the MTJ element 100 can be changed by causing current to flow through the MTJ element 100. The magnetization direction of the storage layer 110 varies with the direction of current flowing through the MTJ element 100.

The fact that the magnetization direction of the reference layer 120 is invariable (or fixed) means that the magnetization direction of the reference layer 120 is not changed when current (magnetization switching current) having a certain value to invert the magnetization direction of the storage layer 110 has flowed through the reference layer 120.

In the STT-MRAM, the magnetization switching threshold value of the reference layer 120 for the current is larger than that of the storage layer 110 for the current. Thus, the magnetization direction of the reference layer 120 is set invariable.

In the first embodiment, currents Iw1 and Iw2 for changing the magnetization alignment state of the MTJ element (for changing the magnetization direction of the storage layer 110) are called write currents Iw1 and Iw2.

The write driver/sinkers 150 and 151 supply the write currents Iw1 and Iw2 to a memory cell MC.

In accordance with data to be written to a memory cell MC, the direction in which the write currents Iw1 and Iw2 flow to the memory cell MC, is controlled.

When the write currents flow between the two magnetic layers 110 and 120 through the tunnel barrier layer 130, spin torque is caused by electrons included in the write currents. If the spin torque is applied to the magnetization of the storage layer 110, the magnetization direction of the storage layer 110 is changed.

When the magnetization alignment state of the MTJ element 100 is changed from the AP state to the P state, the current Iw1 is caused to flow into the MTJ element 100. The current Iw1 flows toward the reference layer 120 from the storage layer 110. The spin torque of electrons with spin of the direction which is equal to the magnetization direction of the reference layer 120, is applied to the magnetization of the storage layer 110. The spin torque makes the magnetization direction of the storage layer 110 equal to that of the reference layer 120. Accordingly, the magnetization alignment state of the MTJ element 100 is changed from the AP state to the P state, with the result that the MTJ element 100 is set in a low-resistance state.

Even though the current Iw1 flows into the MTJ element 100 in the P state, the MTJ element 100 remains in the P state.

When the magnetization alignment state of the MTJ element 100 is changed from the P state to the AP state, the current Iw2 is caused to flow into the MTJ element 100, The current Iw2 flows toward the storage layer 110 from the reference layer 120. The spin torque of electrons with spin of the direction which is opposite to the magnetization direction of the reference layer 120, is applied to the magnetization of the storage layer 110. The spin torque makes the magnetization direction of the storage layer 110 opposite to that of the reference layer 120.

Accordingly, the magnetization alignment state of the MTJ element 100 is changed from the AP state to the AP state, with the result that the MTJ element 100 is set in a high-resistance state.

Even though the current Iw2 flows into the MTJ element 100 in the AP state, the MTJ element 100 remains in the AP state.

As described above, the resistance state (magnetization alignment state) of the MTJ element 100 varies with the direction of write currents Iw1 and Iw2 flowing through the MTJ element 100.

In the MRAM of the first embodiment, therefore, predetermined data can be written to the memory cell MC.

<Read Operation>

In the MRAM of the first embodiment, when data is read from a memory cell MC, data in the memory cell MC is determined based upon the magnitude of output of the memory cell MC corresponding to the resistance state of the MTJ element 100.

For example, the magnitude of output of the memory cell MC is sensed by causing current Ir to flow into the MTJ element 100.

In the first embodiment, current Ir for determining a resistance state of the MTJ element 100 is called read current Ir. The current value of the read current Ir is smaller than that of the write currents Iw1 and Iw2.

The current value of current output from the memory cell MC or the potential of a node connected to the memory cell MC varies with the resistance state of the MTJ element 100.

The current value output from the memory cell MC or the node potential is sensed by the sense amplifier circuit 141. The sense amplifier circuit 141 compares a sensing result and a reference value. The sense amplifier circuit 141 amplifies a signal value indicating a comparison result and outputs the amplified value.

Based on the comparison result, a resistance state of the MTJ element 100 is determined. If the MTJ element is in a high-resistance state, the current value of current output from the memory cell MC (or the node potential) is smaller than the reference value. If the MTJ element is in a low-resistance state, the current value (or the node potential) of current output from the memory cell MC is larger than the reference value.

The signal value based on the comparison result is treated as data in the memory cell MC In the MRAM of the first embodiment, therefore, data can be read from the memory cell MC.

(b-2) Exemplary Basic Operation

An exemplary basic operation of the memory system and the MRAM according to the first embodiment will be described with reference to FIG. 5. The operation of the memory system and the MRAM according to the first embodiment will be described, appropriately referring to FIGS. 1-4 as well as FIG. 5.

FIG. 5 is a timing chart showing a read operation of the memory system and the MRAM according to the first embodiment. (a) and (b) of FIG. 5 show various signals transmitted and received between the memory controller 9 and the MRAM 1.

(a) of FIG. 5 is a timing chart of a first operation mode of the memory system and the MRAM according to the first embodiment.

As shown in (a) of FIG. 5, the memory controller 9 transmits an active command ACT and an address ADR as signals CA to the MRAM 1 with timing based upon a clock signal CLK.

The MRAM 1 receives the active command ACT and address ADR through the terminal 81. The active command ACT and address ADR are stored in the command/address latch circuit 11A. For example, the address ADR transmitted and received together with the command ACT is a bank address and a row address.

The memory controller 9 transmits a read command RD and an address ADR as signals CA to the MRAM 1 after a lapse of a time period tRCD from the transmission of the active command ACT.

The MRAM 1 receives the read command RD and address ADR through the terminal 81. The read command RD and address ADR are stored in the command/address latch circuit 11A. For example, the address ADR transmitted and received together with the command RD is a column address.

The decoder circuit 12 decodes the address ADR. The decoder circuit 12 outputs the decoding result to the row control circuit 13A and the column control circuit 13B.

The row control circuit 13A controls the row of the memory cell array 10 based upon the active command ACT and the decoding result. Thus, a word line (a selected word line) WL corresponding to the address ADR is activated.

The column control circuit 13B controls the column of the memory cell array 10 on the basis of the decoding result. For example, the column control circuit 13B controls the signal level of a control signal CSL on the basis of the decoding result. Among the switching elements, switching elements M1 and M2 supplied with a high-level control signal are turned on. Thus, the global bit lines GBL and hGBL and local bit lines BL and bBL corresponding to the address ADR are activated.

If the word line WL and the bit lines BL and bBL are activated, the memory cell MC indicated by the address ADR is selected. In the following description, a memory cell selected based upon the address ADR will be referred to as a selected cell.

After a lapse of a time period (also referred to as an activation time period hereinafter) T1 for activating a word line, the MRAM 1 performs the operation based upon the command for the selected cell MC.

During a time period (also referred to as an output time period hereinafter) T2 for outputting data from the selected cell (for sensing and comparing a signal), data is read from the selected cell MC on the basis of the read command RD.

For example, in the MRAM of the first embodiment, data is read for each page. In this case, in data reading, a read operation is performed for a plurality of selected cells, and data of one-page data size is output from the memory cell array 10.

During a time period (also referred to as an ECC time period hereinafter) T3 for ECC, the ECC circuit 16 performs an error detection process with respect to data output from the selected cell MC.

If an error is detected from the data, the ECC circuit 16 performs the error detection process for data. The ECC circuit 16 outputs the error-corrected data (also referred to as corrected data hereinafter) to the page buffer circuit 17.

If no error is detected from the data, the ECC circuit 16 does not perform the error correction process. The ECC circuit 16 outputs data for which no error is corrected (also referred to as normal data hereinafter) to the page buffer circuit 17.

The page buffer circuit 17 holds data from the ECC circuit 16.

The data in the page buffer circuit 17 is output to the I/O circuit 11B with a certain timing.

The I/O circuit 11B transmits a data unit DU to the memory controller 9 through the terminal 89 with timing based on a time period (read latency) RLet which is set to start from the reception of the read command RD. The data unit DU is a set of one-bit data DQ.

For example, the data unit DU is data of a data size corresponding to the burst length. In the example of FIG. 5, the burst length of the data unit DU is set to 4. For example, the data unit DU having a burst length of 4 is transmitted in two cycle . The burst length of the data unit may be 8 or 16. For example, the data unit having a burst length of 8 is transmitted in four cycles. For example, the data unit having a burst length of 16 is transmitted in eight cycles. One-page data can be transmitted by transmitting a plurality of data units.

In the MRAM 1 of the first embodiment, the ECC circuit 16 can notify the sequencer 19 of the presence or absence of an error in data (the presence or absence of an error correction process).

In response to the notification (signal) from the ECC circuit 16, the sequencer 19 transmits a signal (flag) FWB indicating the presence or absence of an error in data to the memory controller 9 (or the host device 999).

The memory controller 9 receives the flag FWB.

The memory controller 9 determines whether an ECC process has been performed based on the received flag FWB.

As shown in (a) of FIG. 5, when a signal (e.g. a signal of a first signal level) Z1 indicating that an error correction process has been performed is transmitted to the memory controller 9 from the MRAM 1 as a flag FWB, the memory controller 9 transmits various signals CA and CNT to the MRAM 1 such that the MRAM I can perform a write-back process.

In the first embodiment, when the memory controller instructs the MRAM 1 to perform a write-back process, the memory controller 9 transmits a signal X1 of the first signal level as well as a write command WR to the MRAM 1 as a data mask signal DM.

In response to write command and the data mask signal DM having a first signal level, the MRAM 1 performs a write-back process during a time period (also referred to as a write-back period hereinafter) T4. In the first embodiment, for example, the write-back process is performed using a data mask function of the memory system 1.

In the write-back process, the MRAM 1 causes the write circuit 15 to write the corrected data in the page buffer circuit 17 to a selected cell MC of address ADR corresponding to the read command RD.

The corrected data is therefore written to the selected cell MC.

The memory controller 9 transmits a precharge command PCG and an address ADR to the MRAM 1 after a lapse of a time period (a time period from the transmission of the read command to that of the precharge command) tRTPa which is set to start from the transmission of the read command RD (or the reception of the read command RD in the MRAM 1).

The MRAM 1 receives the precharge command PCG and the address ADR. Accordingly, the MRAM 1 performs a precharge operation for an interconnect (e.g. the global bit line and the bit line) corresponding to the address ADR in a time period (also referred to as a precharge period) T5. Thus, the interconnect in the MRAM 1 is charged. The address (address value) transmitted together with the precharge command PCG is the same as the address transmitted together with the read command.

When the read data includes an error (when an error correction process is performed) as described above, a first mode operation including the write-back process between the read operation and the precharge operation is performed in the memory system according to the first embodiment.

(b) of FIG. 5 is a timing chart of a second operation mode of the memory system and the MRAM according to the first embodiment.

In the case of of FIG. 5, no error correction process is performed because no error is detected from data in the ECC process.

Data is transferred to the memory controller 9 from the MRAM 1 in response to a command from the memory controller 9 by performing substantially the same operation as that of (a) of FIG. 5.

When there is no error correction process for data, a signal (e.g. a signal of a second signal level) Z2 indicating that no error correction process is performed is transmitted to the memory controller 9 from the MRAM 1 as a flag FWB. In this case, the memory controller 9 transmits various signals CA and CNT to the MRAM 1 such that the MRAM 1 performs a precharge operation without receiving an instruction of a write-back process.

The memory controller 9 transmits a signal X2 having the second signal level as a data mask signal DM to the MRAM 1. The memory controller 9 issues no write command WR. Thus, no write command WR is transmitted to the MRAM 1.

The memory controller 9 transmits the precharge command PCG to the MRAM 1 in a time period (a time period from transmission of the read command to that of the precharge command) tRTPb which is set to start from the reception (transmission) of the read command RD, without transmitting the write command WR.

The MRAM 1 receives the precharge command PCG and the address ADR. Thus, the MRAM 1 precharges an interconnect corresponding to the address ADR.

In the first embodiment, the time period tRTPb during which the flag FWB is set to the signal Z2 (no write-back process is performed) is shorter than a time period tRTPa during which the flag FWB is set to the signal Z1 (a write-back process is performed).

When the read data includes no error-no error correction process is performed as described above, a second mode operation including no write-back process between the read operation and the precharge operation is performed in the memory system according to the first embodiment.

As described above, in the memory system 900 and the MRAM 1 according to the first embodiment, the memory controller 9 controls whether the MRAM 1 performs a write-back process.

The memory system 900 and the MRAM 1 according to the first embodiment can control timing for precharging in accordance with the presence or absence of a write-back process.

As a result, as shown in FIG. 5, the memory system 900 and the MRAM 1 according to the first embodiment can shorten the time period from transmission of the read command to the start of the precharge when no write-back process is performed.

Thus, the memory system 900 and the MRAM 1 according to the first embodiment can increase the speed of the operation of the memory system and the resistance change type memory.

Therefore, the memory system and the resistance change type memory according to the first embodiment can improve in their operating characteristics.

(c) Specific Example

A specific example of the memory system and the resistance change type memory according to the first embodiment will be described with reference to FIGS. 6-9.

(c-1) Exemplary Configuration

A specific example of the configuration of the memory system and the resistance change type memory (e.g. MRAM) according to the first embodiment will be described with reference to FIG. 6.

Figure 6:
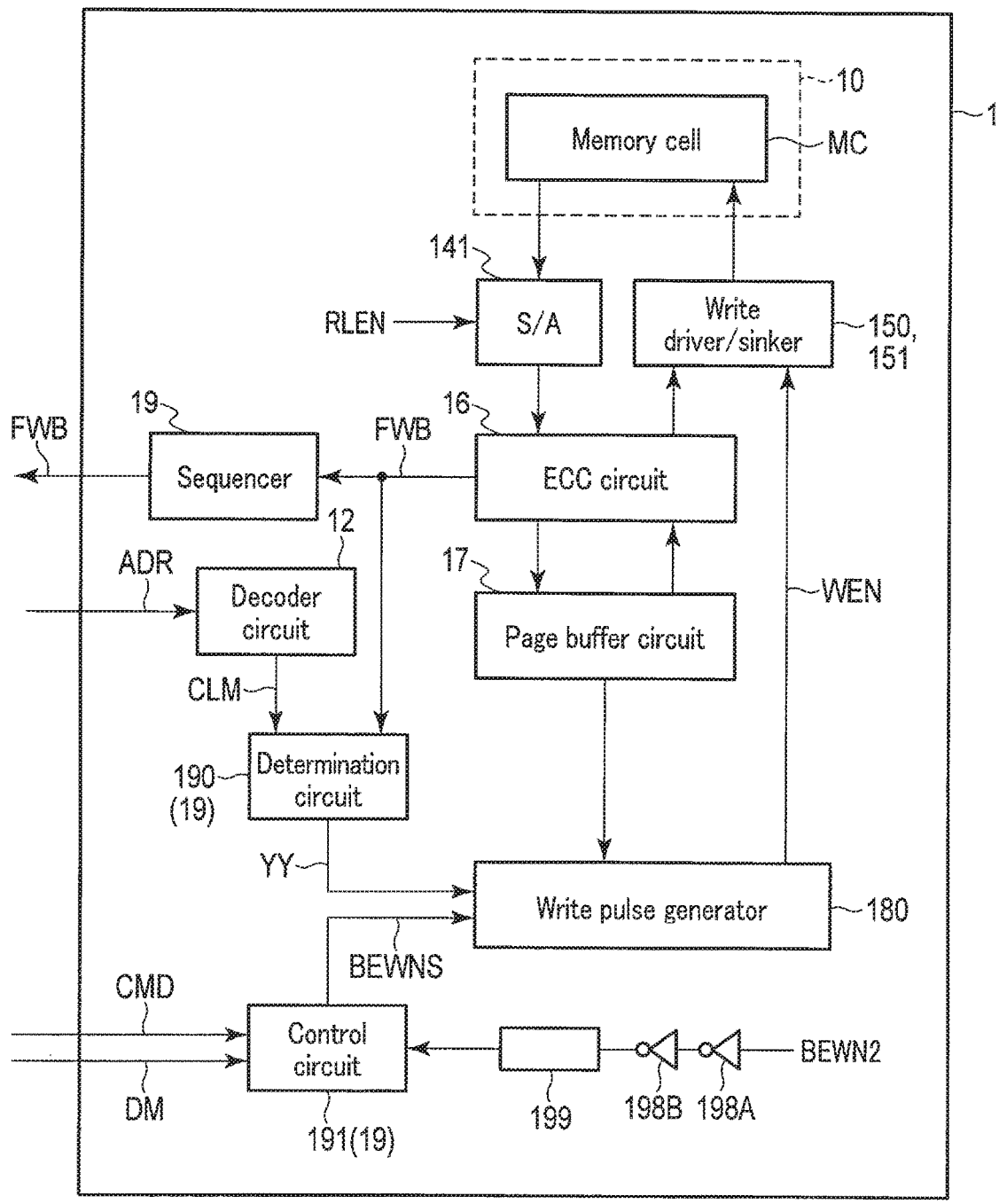

FIG. 6 schematically shows the flow of a signal in the internal configuration (circuit) which is associated with the read operation and write-back process of the MRAM according to the first embodiment.

As shown in FIG. 6, in read operation, a control signal (also referred to as a read start signal hereinafter) RLEN related to the read operation is supplied to the sense amplifier circuit 141 from the sequencer 19. The sense amplifier circuit 141 is activated and operated in response to the read start signal RLEN.

For example, data reading is performed for each page.

In FIG. 6, only one memory cell and only one sense amplifier 141 is shown. In data read operation, however, a plurality of memory cells (a plurality of columns) corresponding to a page size are simultaneously selected, and a plurality of sense amplifiers 141 are operated in parallel.

The sense amplifier 141 supplies the ECC circuit 16 with data read from a selected cell.

The ECC circuit 16 generates a flag FWB based upon the detection and correction of an error. The ECC circuit 16 outputs the flag FWB to an external device (e.g. memory controller 9) via the sequencer 19. The ECC circuit 16 outputs the flag FWB to a determination circuit 190 as well as an external device. The flag FWB is, for example, a signal of one or more bits. In response to a signal (information) indicating a result of the ECC process performed by the ECC circuit 16, the sequencer 19 may set a value of the flag FWB related to the write-back process (or generate a flag).

The ECC circuit 16 supplies the page buffer circuit 17 with data subjected to the ECC process.

The page buffer circuit 17 holds data from the ECC circuit 16 until it is determined whether at least the write-back process should be performed or not. For example, the page buffer circuit 17 can notify a write control signal generation circuit 180 of the data holding state.

The determination circuit (first determination circuit) 190 performs a computation process using the flag FWB and the signal CLM. The determination circuit 190 determines by the computation process whether a selected cell (selected column) corresponding to the determination circuit 190 is a target for a write-back process.

For example, the signal CLM is supplied from the decoder circuit 12. The signal CLM is generated based upon a column address. For example, the signal CLM is a decoding result of a column address.

The determination circuit 190 outputs a signal YY indicative of a determination result to the write control signal generation circuit 180.

The determination circuit 190 sets the signal YY at an "L" level when the flag FWB indicates that data in a selected cell includes no error and the decoding result of a column address does not indicate a memory cell corresponding to the determination circuit 190.

The determination circuit 190 sets the signal YY at an "H" level when the flag FWB indicates that data in a selected cell includes an error or the decoding result of a column address indicates a memory cell corresponding to the determination circuit 190.

The signal YY of the determination circuit 190 indicates whether an error is caused in data in a selected cell (selected address).

For example, the determination circuit 190 can he provided in the sequencer 19. For example, the determination circuit 190 includes an OR gate (logical disjunction circuit).

A control circuit 191 is supplied with a control signal BWEN2. The control signal BWEN2 is supplied to the control circuit 191 via a plurality of inverters 198A and 1983, a delay circuit 199 and the like. The control signal (write start signal) BWEN2 represents timing with which a write operation starts. For example, the write start signal BWEN2 activates the control circuit 191.

The control circuit (second determination circuit) 191 performs a computation process using the command CMD and the data mask signal DM. The control circuit 191 outputs a signal indicative of a computation result (referred to as a write enable start signal hereinafter) BWENS to the write control signal generation circuit 180.

For example, the control circuit 191 sets a signal level of the signal BWENS at a first level (e.g. "H" level) when the command CMD represents a write command and the data mask signal DM represents an execution of a write-back process.

The control circuit 191 sets a signal level of the signal BWENS at a second level (e.g. "L" level) which differs from the first level when the command CMD does not represent a write command or the data mask signal DM does not represent an execution of a write-back process.

The write start signal BWEN2 can be used for a computation process to control a write operation (write-back process) in the control circuit 191, together with the command CMD and the signal DM.

For example, the control circuit 191 can be provided in the sequencer 19.

The write control signal generation circuit 180 controls the signal level of a write enable signal WEN to control a write-back process in response to the signal YY from the determination circuit 190 and the signal BWENS from the control circuit 191.

The write control signal generation circuit 180 outputs a write enable signal WEN indicative of an execution of a write-back process when the signal YY indicates that an error is caused in data in a selected address and the signal BWENS indicates a write operation in data mask state (a write operation using data in the page buffer circuit 17).

The write driver/sinkers 150 and 151 supply a write current to the memory cell MC in response to the write enable signal WEN.

In the write-back process, data of the page buffer circuit 17 is written to the memory cell MC.

The data of the page buffer circuit 17 is supplied to the write driver/sinkers 150 and 151 through the ECC circuit 16. Based on the data, a direction in which the write current is caused to flow is determined.

For example, when the data of the page buffer circuit 17 is supplied through the ECC circuit 16, the ECC circuit 16 performs a computation process again to perform an ECC process for the data. The data of the page buffer circuit 17 can be supplied directly or indirectly to the write driver/sinkers 150 and 151 without performing a computation process again by the ECC circuit 16.

FIG. 6 shows an example of the circuit for determining a write-back process. The circuit is not limited to that shown in FIG. 6 if the write-back process is performed using data in the page buffer circuit 17.

As described above, according to the first embodiment, the MRAM 1 transmits to the memory controller 9 a flag FWB indicating whether the ECC circuit 16 has corrected an error of data in the read operation corresponding to the read command.

For example, when the ECC circuit 16 has corrected an error, the MRAM 1 transmits a high(H)-level signal Z1 to the memory controller 9 as a flag FWB.

On the other hand, when the ECC circuit 16 did not correct an error, the MRAM 1 transmits a low(L)-level signal Z2 to the memory controller 9 as a flag FWB.

Upon receipt of the flag FWB from the MRAM 1, the memory controller 9 performs an issuance of a command and setting of a control signal.

When the memory controller 9 determines that a write-back process is performed based on the flag FWB (high-level signal Z1), the memory controller 9 transmits the write command WR as a command CMD and transmits the high-level data mask signal DM (signal X1) to the MRAM 1.

Thus, the MRAM 1 of the first embodiment performs a write-back process using data (corrected data) in the page buffer circuit 17 before a performance of a precharge operation.

The MRAM 1 of the first embodiment performs a precharge operation after a completion of the write-back process.

When the memory controller 9 determines that a write-back process is not performed based on the flag FWB (low-level signal Z2), the memory controller 9 transmits the precharge command PCG as a command CMD. In this case, the memory controller 9 transmits the low-level data mask signal DM (signal X2) to the MRAM 1.

The control circuit 191 is thus supplied with the precharge command PCG and the low-level signal DM.

Therefore, the MRAM 1 of the first embodiment performs a precharge operation without performing a write-back process.

(c-2) Exemplary Operation

An exemplary operation of the memory system and the MRAM according to the first embodiment will be described with reference to FIGS. 7-9.

First, a specific example of the operation of the memory system and the MRAM according to the first embodiment will be described also referring to FIGS. 1-6 appropriately.

Figure 7:
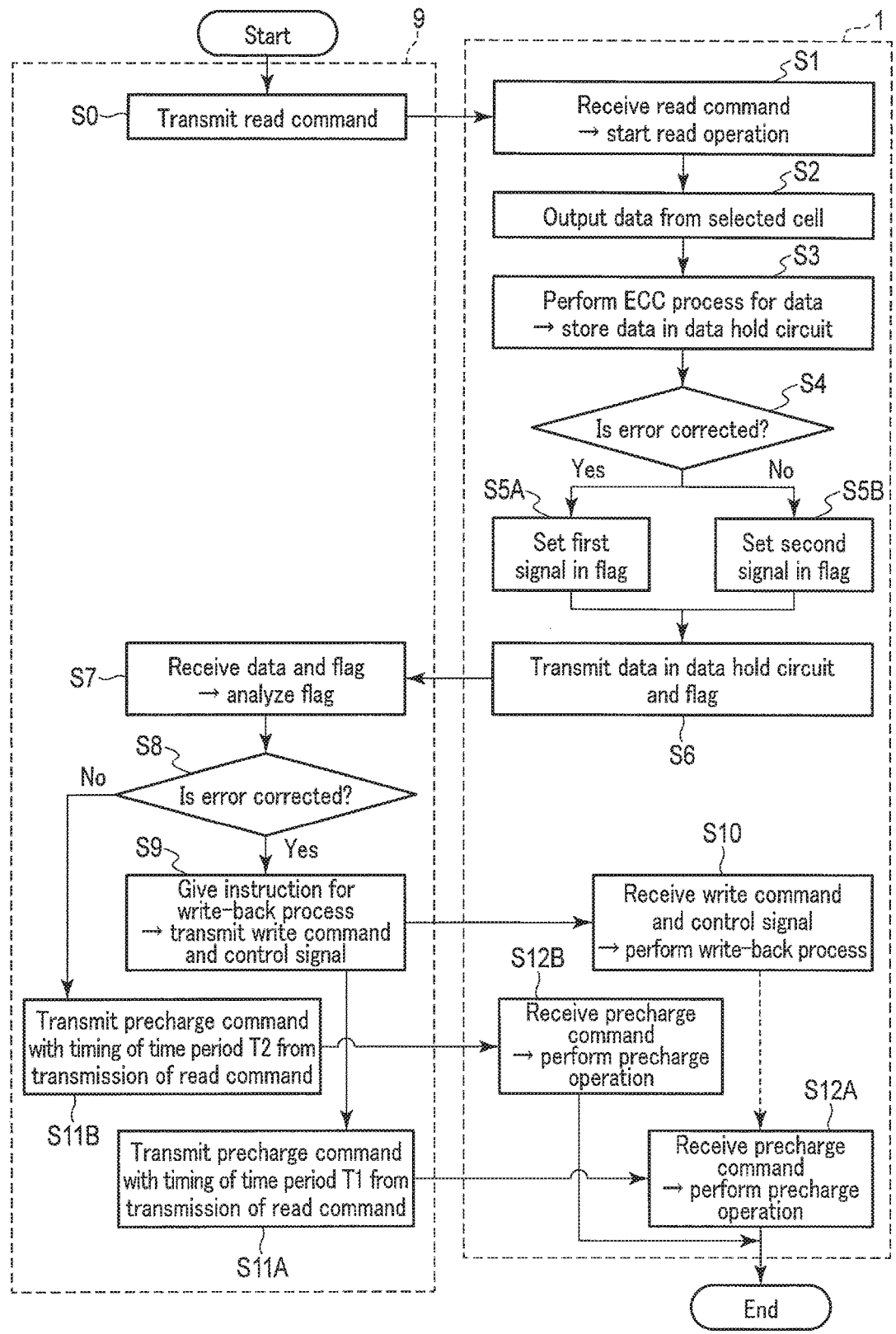

FIG. 7 is a flowchart illustrating the operation of the memory system and the MRAM according to the first embodiment. FIGS. 8 and 9 are timing charts illustrating the operation of the memory system and the MRAM according to the first embodiment.

As illustrated in FIG. 7, when the host device 999 requests the memory controller 9 to read data, the memory controller 9 transmits a command to the MRAM 1 (step S0).

Figure 8:
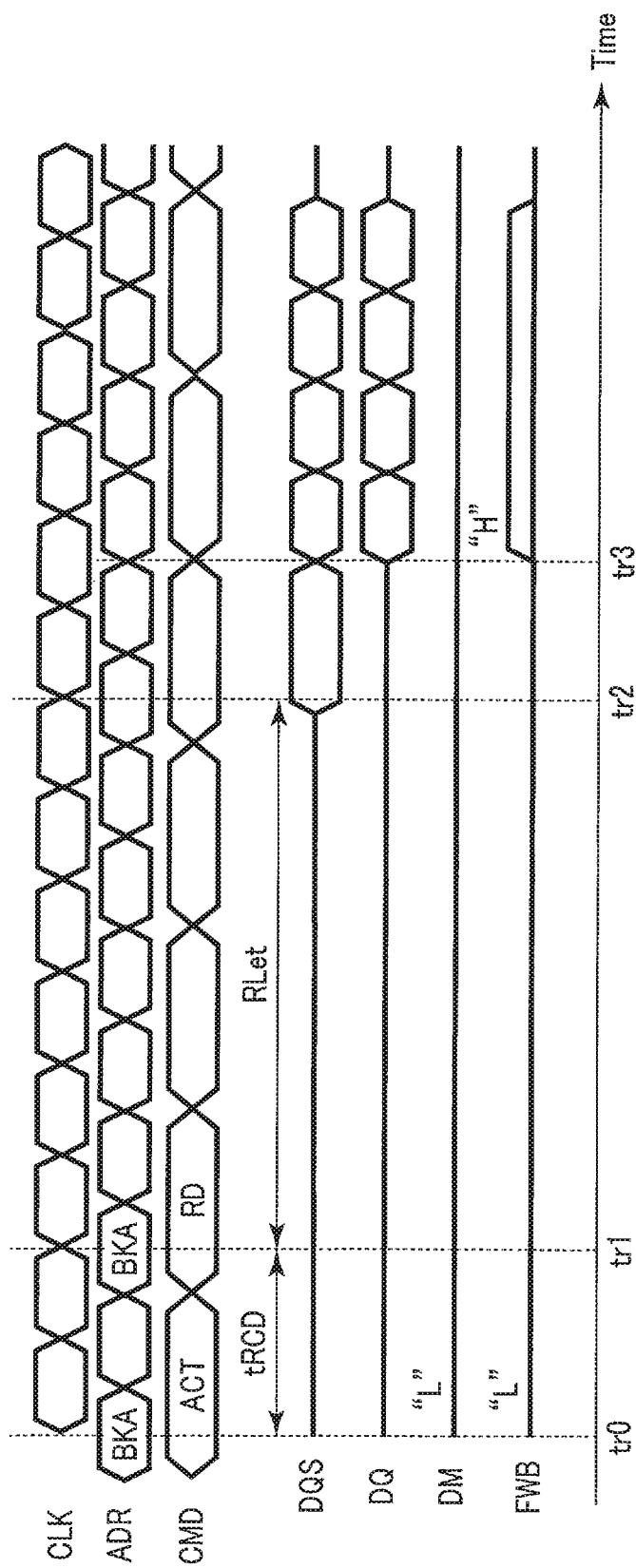

As illustrated in FIG. 8 (FIG. 5), at time tr0, the memory controller 9 transmits an active command ACT and an address (a bank address BKA and a row address) ADR to the MRAM 1.

At time tr1, the memory controller 9 transmits a read command RD and an address ADR (a column address) to the MRAM 1.

In the MRAM 1, the sequencer 19 starts a read operation based on the active command ACT and the read command RD (step S1).

The sequencer 19 controls activation of a word line WL based on the active command ACT. The sequencer 19 controls a control signal for read operation based on the read command RD.

The memory cell MC represented by the address ADR is selected by the row and column control circuits 13A and 13B. Accordingly, the selected cell MC is set in a state in which data can be output.

Inside the MRAM 1, the sequencer 19 reads data from the selected cell (step S2).

The sequencer 19 controls the signal level of a read start signal RLEN with a certain timing to activate the sense amplifier circuit 141.

Thus, the output signal of the selected cell MC is sensed and amplified by the sense amplifier circuit 141. As a result, data of the selected cell MC is read. For example, data for one page is read from the memory cell array 10.

The data from the selected cell MC is supplied to the ECC circuit 16.

The ECC circuit 16 performs an ECC process for the data read from the selected cell MC (step S3)

The ECC circuit 16 determines whether an error is detected from the data by the error detection process.

When an error is detected from the data, the ECC circuit 16 corrects the error by the error correction process. Accordingly, the error-corrected data (corrected data) is generated.

The ECC circuit 16 transfers the corrected data to the page buffer circuit 17.

When no error is detected from the data, the ECC circuit 16 transfers data (normal data) from the memory cell MC to the page buffer circuit 17 without performing an error correction process.

The page buffer circuit 17 receives data (corrected data or normal data) from the ECC circuit 16. The page buffer circuit 17 holds data until new data is provided.

When the error correction process is performed (YES in step S4), the ECC circuit 16 sets a first signal (e.g. a high-level signal) in the flag FWB (step S5A).

When no error is included in the data or no error correction process is performed (NO in step S4), the ECC circuit 16 sets a second signal (e.g. a low-level signal) in the flag FWB (step S5B).

The sequencer 19 transfers data in the page buffer circuit 17 to the memory controller 9 as read data DQ corresponding to the read command RD (step S6).

For example, as illustrated in FIG. 8, the sequencer 19 drives a data strobe signal DQS with timing (time tr2) based upon the read latency RLet. Accordingly, the MRAM 1 notifies the memory controller 9 that the MRAM 1 can transmit the data DQ. The data DQ is transferred to the memory controller 9 from the MRAM 1 with timing synchronized with the transition of the signal level of the data strobe signal DQS.

In the MRAM 1 of the first embodiment, at time tr3, the ECC circuit 17 (or the sequencer 19) transfers a flag FWB indicative of the presence or absence of error correction to the memory controller 9 together with the data DQ. The flag FWB can be transferred to the memory controller 9 during, before or after the transfer of the data DQ.

As a terminal for the transfer of the flag FWB, a reserve terminal (an expanded-function terminal) of the MRAM 1 can be used or a new terminal can be attached to a chip (package) of the MRAM 1. Of the existent terminals of the MRAM 1, a terminal that is not used during the transfer of data from the MRAM 1 to the memory controller 9, can be used for the transfer of the flag FWB.

The memory controller 9 receives the data DQ and flag FWB from the MRAM 1 (step S7).

The memory controller 9 transfers the data DQ to the host device 999. The memory controller 9 analyzes the flag FWB.

Based on a result of the analysis of the flag FWB, the memory controller 9 determines whether an error correction process is performed (whether an error is detected from data in the memory cell) in the ECC process in the MRAM 1 (step S8).

When the memory controller 9 determines that an error correction process is performed based on the analysis result (when the flag FWB is the high-level signal Z1), the memory controller 9 instructs the MRAM 1 to perform a write-back process (step S9).

The memory controller 9 transmits a write command WD and a data mask signal DM to the MRAM 1 to instruct the MRAM 1 to perform a write-back process.

As illustrated in FIG. 9, time tw0, the memory controller 9 transmits an active command ACT (and an address ADR) to perform a write-back process. At time tw1, the memory controller 9 transmits a write command WR (and an address). The address (address value) ADR transmitted at the time of the instruction for the write-back process is the same as the address ADR transmitted at the time of read operation.

The MRAM 1 receives the write command WR, address ADR and data mask signal DM (step S10).

In response to the write command WR, the sequencer 19 performs various control operations to perform a write operation (write-back process) (step S10).

The data strobe signal DQS is driven with timing based on write latency WLet, e.g. at time tw2.

At time tw3, the memory controller 9 sets the signal level of the data mask signal DM at a high level on the basis of the timing of the data strobe signal DQS. During an execution of the write-back process, the memory controller 9 does not transmit data to the MRAM 1. In this case, for example, the potential of a data line DQ is indefinite.

In a write operation (normal write) of externally data to the MRAM 1, the externally data to be written is output onto the data line DQ with the signal level of the data mask signal DM at a low level at time tw3.

In the memory system according to the first embodiment, for example, when an instruction for a write-back process is given, the signal level of the data mask signal DM corresponding to a target area (e.g. a page) for the write-back process is set at a high level during the data transfer period (a period from the start of data transfer to the end thereof) which corresponds to the write command.

As described above, in the memory system of the first embodiment, the MRAM 1 can perform a write-back process based on the write command WR and the data mask signal DM.

The MRAM 1 writes data (corrected data) in the page buffer circuit 17 to the selected cell MC based on the write command WR and the high-level data mask signal DM.

The determination circuit 190 controls the signal level of a control signal YY based on a signal (a decoding result of the column address ADR) CLM and the flag FWB.

The determination circuit 190 outputs the control signal YY to the write control signal generation circuit 180.

The control circuit 191 controls the signal level of a signal BWENS based on the write command WR, the high-level data mask signal DM and the signal BWEN2.

The control circuit 191 outputs the signal BWENS to the write control signal generation circuit 180.

In response to the signal YY and the signal BWENS, the write control signal generation circuit 180 controls the signal level of a write enable signal WEN related to the write-back process. The write control signal generation circuit 180 outputs the write enable signal WEN to the write driver/sinkers 150 and 151.

When the write-back process is performed, the signal level of the write enable signal WEN is set at a high level, for example.

The high-level write enable signal WEN is supplied to the write driver/sinkers 150 and 151. The high-level write enable signal WEN activates the write driver/sinkers 150 and 151.

The data (corrected data) in the page buffer circuit 17 is supplied to the write driver/sinkers 150 and 151 through the ECC circuit 16.

Thus, the write driver/sinkers 150 and 151 supply the selected cell MC with write currents Iw1 and Iw2 corresponding to the corrected data.

The corrected data is supplied to the selected cell MC through the ECC circuit 16 and the write driver/sinkers 150 and 151. For example, the ECC circuit 16 performs a computation process again to add a new parity to the corrected data. However, the corrected data can be supplied to the write driver/sinkers 150 and 151 from the page buffer circuit 17 without going through the ECC circuit 16.

The write-back process is performed for a target page for data read, e.g. for all column addresses in a certain bank BNK.

Giving an instruction for a write-back process, the memory controller 9 transmits a precharge command with a predetermined timing (e.g. a period set to assure the completion of the write-back process) T1 (=tRTPa) (step S11A).

When the write-back process is completed, the MRAM 1 precharges an interconnect (e.g. a global bit line and a bit line) based on the precharge command (step S12A).

Furthermore, when the memory controller 9 determines that no error correction process is performed on the basis of the analysis result of the flag FWB (when the flag FWB is the low-level signal Z2), the memory controller 9 transmits a precharge command to the MRAM 1 with a certain timing (e.g. a period set to assure the start of the precharge) T2 (=tRTPb) without transmitting an instruction for a write-back process (step SUB). The timing (period) T2 is shorter than the timing (period) T1.

In this case, the memory controller 9 does not transmit a write command but a precharge command PCG with the signal level of the data mask signal DM at a low level.

The MRAM 1 receives the precharge command PCG (step S12B).

In the internal circuit of the MRAM 1, the determination circuit 190 and the control circuit 191 control the signal levels of the signals YY and BWENS so that a write-back process is not performed.

Therefore, the MRAM 1 performs a precharge operation based on the precharge command PCG without performing a write-back process.

The interconnect (e.g. global bit lines or bit lines) in the memory cell array is charged by the precharge operation in step S12A or S12B.

Thus, the operations of the memory system and the MRAM 1 according to the first embodiment are completed.

As described above, the memory system and the MRAM 1 according to the first embodiment can control and perform a write-back process using a write command and a data mask signal (data mask function).

In the memory system and the MRAM according to the first embodiment, not a write-back process but an operation based upon the data mask function is performed when the data mask signal includes a time period set at a high level and a time period set a low level during the write data transfer period. In the memory system and the MRAM according to the first embodiment, even though the data mask signal is set at a high level when the write command is transmitted after the precharge command is transmitted (in the write operation after the precharge operation), an operation corresponding to the write command is a write operation based on the data mask function.

(d) Summary

In the memory system and the resistance change type memory according to the first embodiment, a signal indicative of the presence or absence of an error in data (data correction) in read operation is transmitted to the memory controller from the resistance change type memory.

In the first embodiment, therefore, the memory controller of the memory system can flexibly control the presence or absence of a performance of a write-back process in the resistance change type memory.

Consequently, the memory system and the resistance change type memory according to the first embodiment make it possible to shorten the time period from transmission of a read command to transmission of a precharge command when no write-back process is performed.

Therefore, the memory system and the resistance change type memory according the first embodiment can operate at high speed.

As described above, the memory system and the resistance change type memory according to the first embodiment can improve in their operating characteristics.

(2) Second Embodiment

A memory system and a resistance change type memory according to a second embodiment will be described with reference to FIG. 10.

Figure 10:
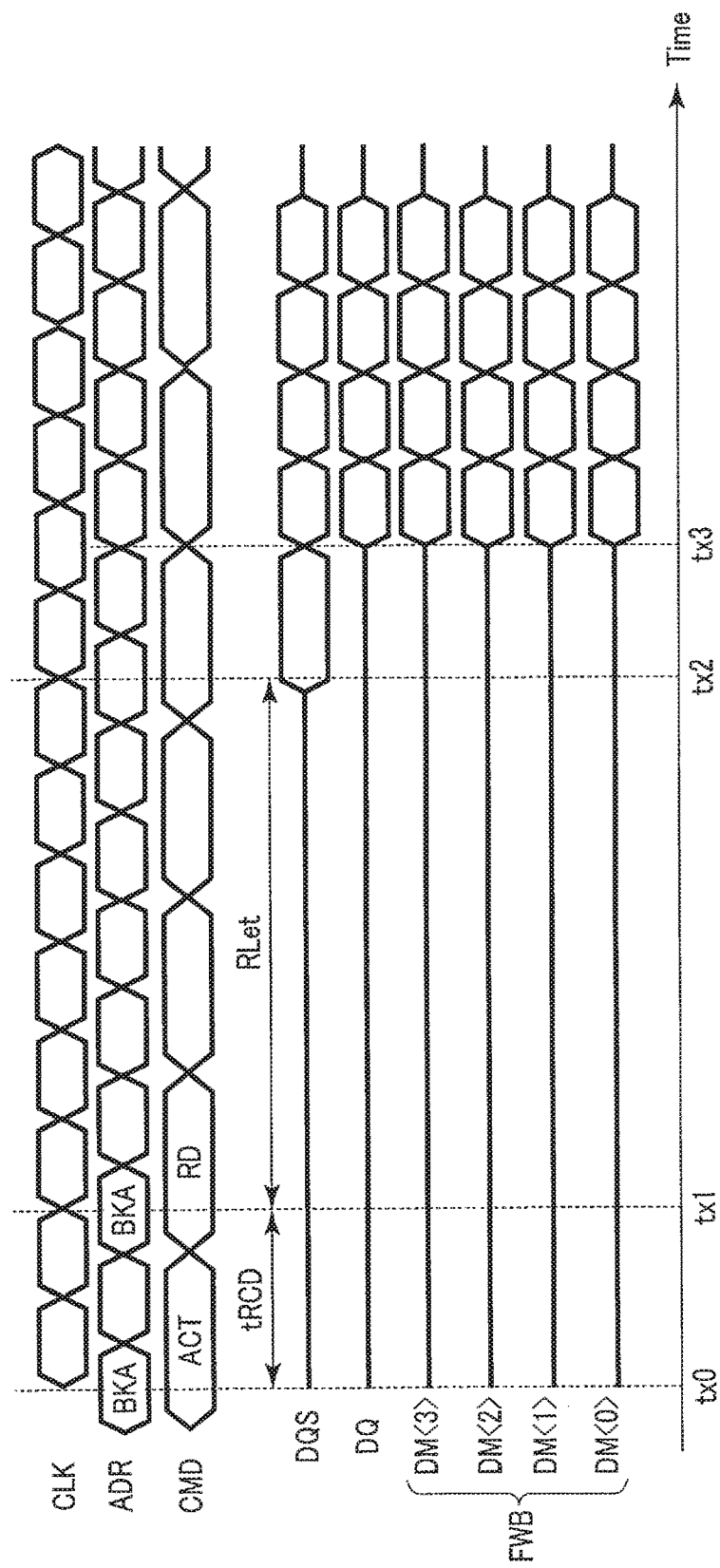
FIG. 10 is a diagram illustrating an exemplary operation of a resistance change type memory according to a second embodiment.

FIG. 10 is a timing chart illustrating an exemplary operation (a control method) of the memory system and the resistance change type memory according to the second embodiment.

In the second embodiment, a resistance change type memory (e.g. MRAM) 1 may notify a memory controller 9 (or a host device 999) of the presence or absence of an error in read data (the presence or absence of error correction) using a data mask signal DM.

As shown in FIG. 10, the MRAM 1 includes a plurality of data mask signals DM (DM<0>, DM<1>, DM<2>, DM<3>). These data mask signals DM are input and output through external connection terminals (pins) which are independent of one another.

The data mask signals DM are set in their respective banks BNK in the MRAM 1. If the number of banks BNK in the MRAM 1 is four, four data mask signals (data mask pins) DM<0>, DM<1>, DM<2>and DM<3> are set to correspond to banks BNK<0>, BNK<1>, BNK<2>and BNK<3>, respectively.

In the memory system according to the second embodiment, therefore, the MRAM 1 can notify the memory controller 9 (or the host device 999) of the presence or absence of an error (error correction) for each of the banks.

For example, a write-back process is performed for each page and a normal write process is performed for each column. In this case, a write-back process for a certain bank and a normal write process for another bank can be performed in parallel (substantially at the same time).

In the memory system of the second embodiment, for example, the memory controller 9 controls the signal level of each of the data mask signals DM to allow a write-back process for a bank BNK<x> corresponding to a data mask signal DM<x> set at a high level and a normal write process for another bank BNK<z> corresponding to a data mask signal DM<z> set at a low level to be performed in parallel.

The data mask signal DM corresponding to a bank BNK for which a write-back process should be performed is maintained at a high level in a cycle corresponding to the transfer period of write data.

As described above, in the memory system according to the second embodiment, the memory controller 9 (or the host device 999) can determine whether a write-back process has been performed for each bank; thus, a plurality of banks BNK in the MRAM 1 can improve in their management efficiency.

Therefore, the memory system and the resistance change type memory according to the second embodiment can improve in their operating characteristics.

(3) Third Embodiment

A memory system and a resistance change type memory according to a third embodiment will be described with reference to FIG. 11.

For descriptions of the memory system and the resistance change type memory according to the third embodiment, FIGS. 1-10 will be referred to appropriately.

In the memory system of the third embodiment, a write-back process for the resistance change type memory (e.g. MRAM) can be controlled by a memory controller using management information of the resistance change type memory in addition to a flag and a data mask signal.

In the memory system shown in FIG. 1, for example, the processor 90 refers to a management table or an access history of the MRAM 1, which are stored in the memory device 7 or the register 99. The processor 90 searches whether a plurality of banks BNK include a target bank BNK for a write-back process on the basis of the issuance history of a command (e.g. an active command and a precharge command), the history of a selected row address, the presence or absence of a flag FWB, etc. in the management table and the access history.

Based on a result of the above search, the memory controller 9 supplies a high-level data mask signal DM to the data mask terminal 83 corresponding to at least one bank BNK targeted for the write-back process.

For example, the write-back process can be performed by interrupt processing.

Figure 11:
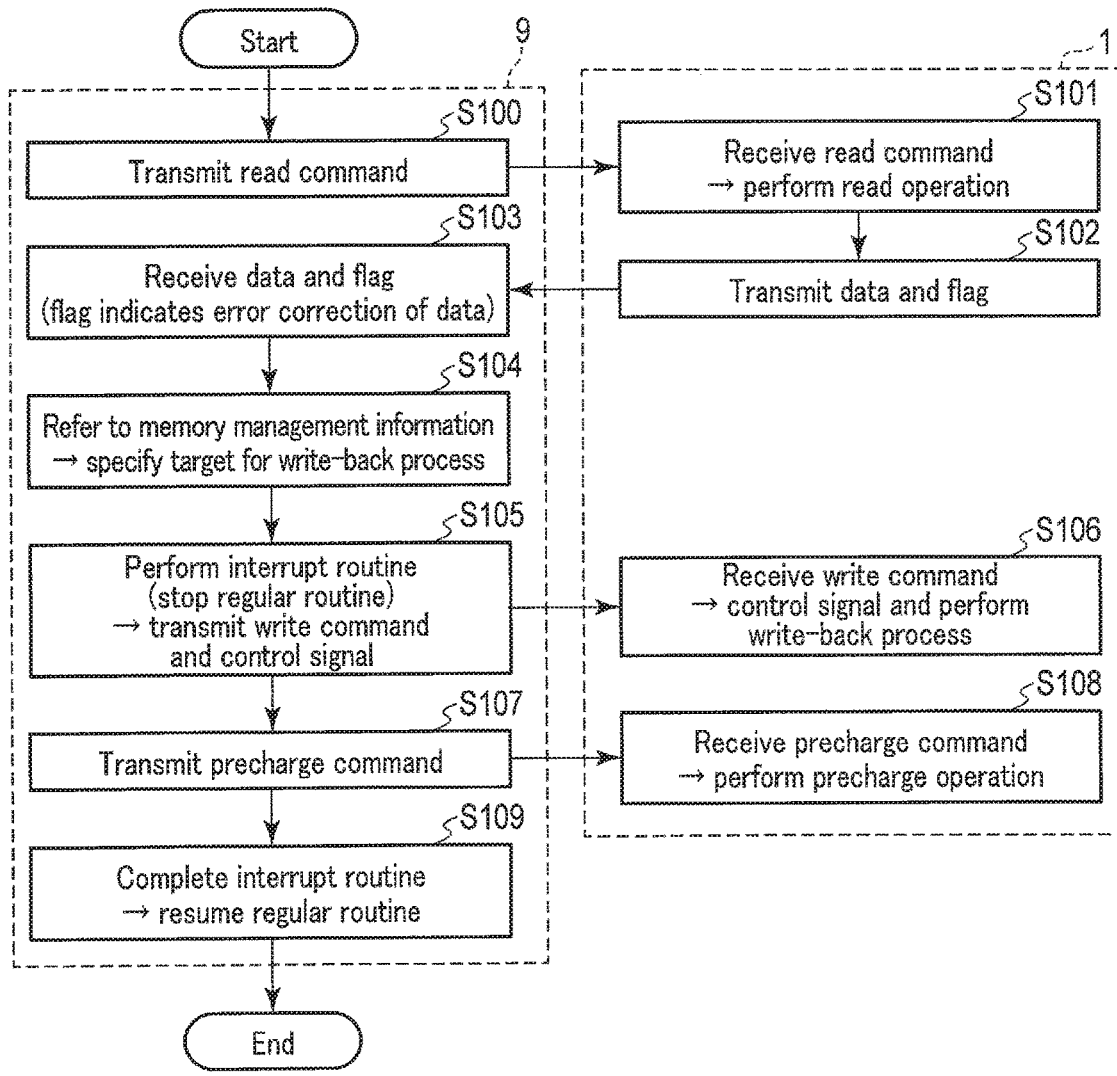
FIG. 11 is a diagram illustrating an exemplary operation of a resistance change type memory according to a third embodiment.

FIG. 11 is a flowchart illustrating an exemplary operation of the memory system according to the third embodiment.

As described above, the memory controller 9 instructs the MRAM 1 to read data corresponding to a selected address ADR using a read command RD (step S100).

As described above, the MRAM 1 performs a read operation based on the read command RD (step S101). The MRAM 1 performs an ECC process for data output from the selected cell. Based on a result of the ECC process, the MRAM 1 sets a value (signal level) of the flag FWB.

The MRAM 1 transmits the ECC-processed data and the flag FWB to the memory controller 9 (step S102).

The memory controller 9 receives the data and flag FWB (step S103).

When the flag FWB indicates that an error correction process is performed (the data of the selected cell includes an error), the processor 90 in the memory controller 9 refers to the memory management information (e.g. management table and access history) in the register 99 and the memory device 7 to confirm a target address (e.g. page) for a write-back process corresponding to the flag FWB (step S104).

Based on a result of the reference to the memory management information, the processor 90 detects a target page for a write-back process and starts to control a write-back process corresponding to a bank BNK including target page for write-back using an interrupt routine.

The interrupt routine control circuit 92 performs the interrupt routine and performs control for the write-back process (step S105).

Based on the flag FWD indicating that an error correction process has been performed, the memory controller 9 stops the operation (computation process) of the regular routine control circuit 91 and starts the operation of the interrupt routine control circuit 92. The regular routine control circuit 91 suspends the operation in response to a request from the host device 999.

As described above (see FIG. 9, for example), the memory controller 9 transmits an active command ACT, an address ADR, a write command WR and a high-level data mask signal DM to the MRAM 1 by operating and controlling the interrupt routine control circuit 92 during an interrupt routine write-back process.

Accordingly, the MRAM 1 performs a write-back process for the target bank BNK (step S106). For example, the MRAM 1 can notify the memory controller 9 of the end of the write-back process.

The memory controller 9 transmits a precharge command PCG and an address ADR to the MRAM 1 after lapse of a predetermined time period (e.g. time period tRTPa) or by notification from the MRAM 1 (step S107). The address ADR transmitted together with the precharge command PCG is an address in which a read operation is performed.

The MRAM 1 receives the precharge command PCG and the address APR (step S108). Based on the precharge command PCG, the MRAM 1 performs a precharge operation in accordance with a selected address ADR.

After the precharge command PCG is transmitted, the processor 90 returns the operation mode for the MRAM 1 to the regular routine from the interrupt routine. The memory controller 9 resumes the operation requested by the host device 999 through the regular routine (step S109).

A transmission of the precharge command PCG after an instruction to perform a write-back process can be performed as a regular routine.

When the flag FWB indicates that no error correction process is performed (data of a selected cell includes no error), the precharge command PCG is transmitted to the MRAM 1 from the memory controller 9 when time period tRTPb has elapsed from the transmission of the read command RD a regular routine.

In the memory system and the resistance change type memory according to the third embodiment, therefore, the write-back process of the resistance change type memory can be controlled using management information in the controller 9.

As described above, the memory system and the resistance change type memory according to the third embodiment can bring about the same advantages as those of the first and second embodiments.

(4) Fourth Embodiment

A memory system and a resistance change type memory according to a fourth embodiment will be described with reference to FIG. 12.

In the fourth embodiment, the MRAM 1 may notify the memory controller 9 that since a flag indicating a result of an ECC process is not transmitted to the memory controller 9, an error correction process is not performed for transmitted data (no error is caused in data in the memory cell) or a write-back process is not be performed.

In the fourth embodiment, the MRAM 1 generates a flag FWB indicating that data includes an error (an error in data is corrected) only when an error correction process is performed for transmitted data (an error is caused in data in the memory cell). The MRAM 1 transmits the generated flag FWB to the memory controller 9.

In the fourth embodiment, the memory controller 9 instructs the MRAM 1 to perform a write-back process when the memory controller 9 receives a flag.

Figure 12:
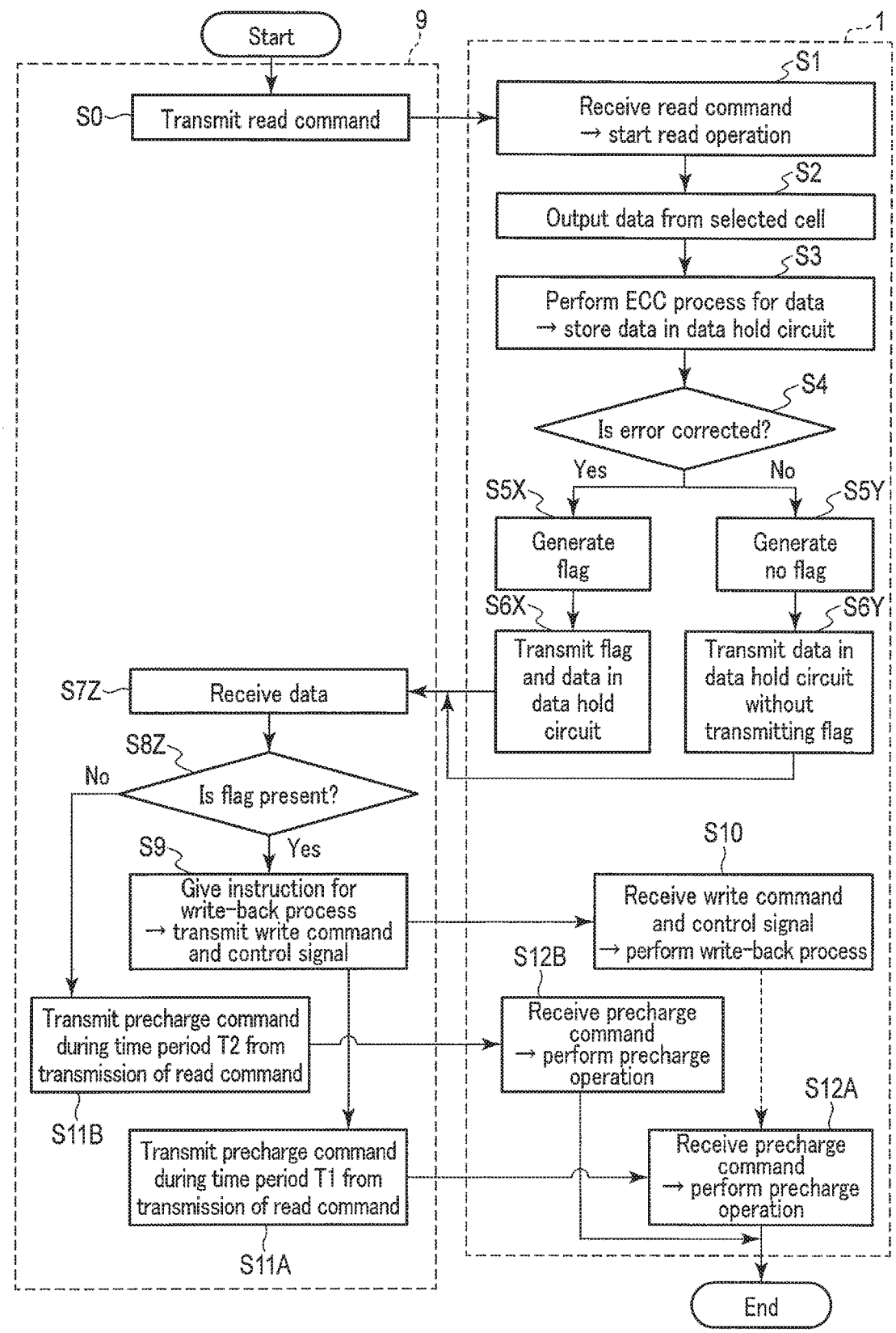
FIG. 12 is a diagram illustrating an exemplary operation of a resistance change type memory according to a fourth embodiment.

FIG. 12 is a flowchart illustrating an exemplary operation of a memory system and a resistance change type memory according to the fourth embodiment.

As illustrated in FIG. 12, data is output from a selected cell to correspond to a read command (steps S0 to S2) as in the foregoing embodiments.

An ECC process is performed for the data (step S3). The ECC-processed data is stored in the page buffer circuit 17.

When the data output from the selected cell includes an error, the error correction process for data is performed by the ECC circuit 16. When the error correction process is performed, the ECC circuit 16 (or the sequencer 19) generates a flag FWB (step S5X).

In this case, the MRAM 1 transmits the corrected data in the page buffer circuit 17 and the generated flag FWB to the memory controller 9 (step S5X).

When the data output from the selected cell includes no error, no error correction process is performed. When no error correction process is performed, no flag FWB is generated (step S5Y).

In this case, the MRAM 1 transmits the data in the page buffer circuit 17 to the memory controller 9 without transmitting a flag FWB (step S6Y).

The memory controller 9 receives data (step S7Z).

The memory controller 9 confirms the presence or absence of a flag FWB (step S8Z). In accordance with the presence or absence of a flag FWB, the memory controller 9 determines whether a write-back process is performed or not.

Like in the foregoing embodiments, the memory controller 9 controls timing of transmission of a precharge command according to whether a write-back process is performed (steps S9 and S11A or step S11B). The MRAM 1 performs a write-back process (step S10) and a precharge operation (steps S12A and S12S) on the basis of a command from the memory controller 9.

As described above, in the memory system and the resistance change type memory according to the fourth embodiment, the MRAM 1 determines whether to generate a flag FWB or not in accordance with the presence or absence of an error in data in a memory cell (the presence or absence of error correction).

In the fourth embodiment, the memory controller 9 can control whether the MRAM 1 performs a write-back process in accordance with the presence or absence of a write-back process.

Consequently, in the memory system of the fourth embodiment, the timing of a precharge operation can be controlled.

As described above, the memory system and the resistance change type memory according to the fourth embodiment can bring about the same advantages as those of the foregoing embodiments.

(5) Others

In the foregoing first to fourth embodiments, an example of controlling a write-back process by a controller (processor) using a data mask signal (data mask function) is shown.

In the memory system and the memory device according to each of the foregoing embodiments, however, a signal other than the data mask signal can be used for a signal to instruct the resistance change type memory (e.g. MRAM) 1 to perform a write-back process from the memory controller 9 if it is possible to determine whether a write-back process is performed based on information about an ECC process transmitted to the controller 9 from the memory 1.

For example, in the memory system and the resistance change type memory according to each of the foregoing embodiments, a resistance change type memory can be instructed to perform a write-back process by a control signal and a write command while no data is input to the resistance change type memory. The control signal may be a signal based upon the specifications and standard of the resistance change type memory and a signal newly set to provide an instruction for a write-back process.

As described above, in the memory system and the resistance change type memory according to the foregoing embodiments, a write-back process can be performed without using a data mask function between a read operation and a precharge operation.

In the memory system and the resistance change type memory according to the foregoing embodiments, a command indicating that an operation to be performed is a write-back process can be set. Thus, the memory controller 9 may transmit a write-back command in place of both the write command and the control signal to cause the memory 1 to perform a write-back process.

In the foregoing embodiments, a parallel magnetization type MTJ element can be used in the MTJ element 100. In the parallel magnetization type MTJ element, the magnetization direction of the magnetic layers 110 and 120 are substantially parallel to the surface of the magnetic layers. In the parallel magnetization type MTJ element, for example, the magnetic anisotropy of the magnetic layers 110 and 120 is set a substantially parallel to the surface of the magnetic layers using shape magnetic anisotropy.

In the foregoing embodiments, a magnetoresistive effect element other than the MTJ element can be used in the MRAM. Furthermore, the resistance change type memory may be a memory other than the MRAM if it is a magnetic memory in which a magnetoresistive effect element is used in a memory element.

The resistance change type memory of the foregoing embodiments may be a ReRAM, a PCRAM, an ion memory or the like.

The resistance change type memory of the foregoing embodiments can be applied to all memories for discriminating data in a memory cell by converting a resistance difference of a resistance change element into a current difference or a voltage difference and sensing it.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
   a resistance change type memory including a memory cell configured to hold first data and an ECC circuit configured to detect and correct an error in the first data; and
   a controller configured to control an operation of the resistance change type memory,
   wherein:
   in a read operation for the resistance change type memory, when the first data from the memory cell includes an error, the resistance change type memory transmits second data in which the error is corrected and a first signal to the controller, and the controller transmits a control signal, a write command, and an address to the resistance change type memory based on the first signal; and
   the resistance change type memory receives the control signal, the write command, and the address, generates a second signal using a column address included in the address and the first signal, generates a third signal using the control signal and the write command, generates a fourth signal using the second signal and the third signal, generates a write pulse based on the fourth signal, and writes the second data to the memory cell using the write pulse.

2. The memory system according to claim 1, wherein the controller transmits a precharge command to the resistance change type memory after the controller transmits the control signal and the write command and after a first period elapses from when the controller transmits a read command.

3. The memory system according to claim 2, wherein:
   when the first data from the memory cell includes no error, the resistance change type memory transmits the first data and a fifth signal to the controller; and
   the controller transmits the precharge command to the resistance change type memory based on the fifth signal after a second period elapses from when the controller transmits the read command.

4. The memory system according to claim 3, wherein the second period is shorter than the first period.

5. The memory system according to claim 1, wherein:
   the resistance change type memory further includes a buffer circuit configured to hold the second data; and
   the second data in the buffer circuit is written to the memory cell based on the fourth signal.

6. The memory system according to claim 1, wherein the control signal is a data mask signal.

7. The memory system according to claim 1, wherein the resistance change type memory transmits the first signal to the controller using a terminal that is equal to a terminal to transfer the control signal.

8. The memory system according to claim 1, wherein the controller transmits the control signal, the write command, and the address based on management information of the resistance change type memory.

9. The memory system according to claim 1, wherein:
   the controller includes a regular routine control circuit and an interrupt routine control circuit; and
   upon receiving the first signal, the controller stops the regular routine control circuit and operates the interrupt routine control circuit to transmit the control signal, the write command, and the address to the resistance change type memory.

10. The memory system according to claim 1, wherein the memory cell includes a magnetoresistive effect element.

11. The memory system according to claim 1, wherein the ECC circuit generates the first signal.

12. A resistance change type memory comprising:
    a memory cell configured to hold first data;
    an ECC circuit configured to detect an error from the first data and to correct the error; and
    a control circuit configured to control an operation of the memory cell and an operation of the ECC circuit,
    wherein in a read operation for the memory cell based on a read command:
    when the first data includes no error, the control circuit transmits the first data and a first signal to an external device; and
    when the first data includes an error, the control circuit transmits second data in which the error is corrected and a second signal to the external device, and receives a control signal, a write command, and an address corresponding to the second signal from the external device, and
    wherein the control circuit generates a third signal using a column address included in the address and the second signal, generates a fourth signal using the control signal and the write command, generates a fifth signal using the third signal and the fourth signal, generates a write pulse based on the fifth signal, and supplies the write pulse to the memory cell to write the second data to the memory cell.

13. The memory according to claim 12, wherein the control circuit charges an interconnect connected to the memory cell based on a first precharge command corresponding to the first signal.

14. The memory according to claim 13, wherein:
    upon receiving the write command, the control circuit receives a second precharge command; and
    the control circuit charges an interconnect connected to the memory cell based on the second precharge command.

15. The memory according to claim 14, wherein a first period from reception of the read command to reception of the first precharge command is shorter than a second period from reception of the read command to reception of the second precharge command.

16. The memory according to claim 13, wherein the control circuit transmits one of the first signal and the second signal to the external device using a terminal that is equal to a terminal to transmit the control signal.

17. The memory according to claim 13, further comprising a buffer circuit configured to hold the second data,
wherein the second data in the buffer circuit is written to the memory cell based on the fifth signal.

18. The memory according to claim 12, wherein the memory cell includes a magnetoresistive effect element.

19. The memory according to claim 12, wherein the ECC circuit generates the second signal.

* * * * *